(12) United States Patent
Kohiro et al.

(10) Patent No.: US 8,492,750 B2
(45) Date of Patent: Jul. 23, 2013

(54) ORGANIC SEMICONDUCTOR COMPOSITION, ORGANIC THIN FILM AND ORGANIC THIN FILM ELEMENT PROVIDED WITH ORGANIC THIN FILM

(75) Inventors: Kenji Kohiro, Tsukuba (JP); Shinichi Yamate, Tsukuba (JP); Akiko Nakazono, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 376 days.

(21) Appl. No.: 12/935,379

(22) PCT Filed: Mar. 24, 2009

(86) PCT No.: PCT/JP2009/055777
§ 371 (c)(1),
(2), (4) Date: Dec. 21, 2010

(87) PCT Pub. No.: WO2009/122956
PCT Pub. Date: Oct. 8, 2009

(65) Prior Publication Data
US 2011/0108813 A1    May 12, 2011

(30) Foreign Application Priority Data
Mar. 31, 2008 (JP) ................ P2008-092302

(51) Int. Cl.
*H01L 35/24* (2006.01)
(52) U.S. Cl.
USPC .................... 257/40; 257/E51.001
(58) Field of Classification Search
USPC ........................... 257/40, E51.001
See application file for complete search history.

(56) References Cited

U.S. PATENT DOCUMENTS

| 6,541,300 | B1 | 4/2003 | Chowdhuri et al. |
| 2004/0038459 | A1 | 2/2004 | Brown et al. |
| 2004/0062930 | A1 | 4/2004 | Roberts et al. |
| 2005/0095459 | A1 | 5/2005 | Chin et al. |
| 2005/0127354 | A1 | 6/2005 | Hanna et al. |
| 2005/0156161 | A1* | 7/2005 | Hanna et al. ............ 257/40 |
| 2006/0155040 | A1 | 7/2006 | Veres et al. |
| 2007/0158646 | A1 | 7/2007 | Reichmanis et al. |
| 2009/0001357 | A1 | 1/2009 | Takimiya et al. |

FOREIGN PATENT DOCUMENTS

GB            2430546 A       3/2007
(Continued)

OTHER PUBLICATIONS

"Solution-Processed Organic FET Using Low-Molecular Compound (Solution-processed organic thin-film transistors based on small molecules)", 54th Annual Academic Meeting of The Japan Society of Applied Physics, 2007, 28a-W-10, with English translation.
B. Kosata et al., "Novel liquid crystals based on [1]benzothieno[3,2-b][1]benzothiophene", Liquid Crystals, vol. 30, No. 5, 2003, pp. 603-610.

(Continued)

*Primary Examiner* — Anthony Ho
(74) *Attorney, Agent, or Firm* — Sughrue Mion, PLLC

(57) ABSTRACT

An object of the present invention is to provide an organic semiconductor composition capable of forming an organic film having high carrier transportability. A preferable organic semiconductor composition contains a lower molecular weight compound and a higher molecular weight compound having carrier transportability, and the solubility parameter of the higher molecular weight compound and the solubility parameter of the lower molecular weight compound differ by 0.6 to 1.5.

10 Claims, 15 Drawing Sheets

FOREIGN PATENT DOCUMENTS

| | | |
|---|---|---|
| JP | 5-110069 A | 4/1993 |
| JP | 2001-308415 A | 11/2001 |
| JP | 2004-006476 A | 1/2004 |
| JP | 2004-158710 A | 6/2004 |
| JP | 2006-514710 A | 5/2006 |
| WO | 03/067667 A1 | 8/2003 |
| WO | 2004/057688 A1 | 7/2004 |
| WO | 2005/055248 A2 | 6/2005 |
| WO | 2007100600 A2 | 9/2007 |

OTHER PUBLICATIONS

Shizuo Tokito et al., Control of Surfaces and Interfaces in Organic Thin-Film Transistors, NHK Science & Technical Research Laboratories, Jan. 15, 2007, pp. 242-248, vol. 28, No. 5, Tokyo.

Extended European Search Report issued Apr. 11, 2012 in EP Patent Application no. 09727837.8.

Office Action issued Mar. 13, 2013 in counterpart European Patent Application No. 09727837.8.

* cited by examiner

ORGANIC SEMICONDUCTOR COMPOSITION, ORGANIC THIN FILM AND ORGANIC THIN FILM ELEMENT PROVIDED WITH ORGANIC THIN FILM

CROSS REFERENCE TO RELATED APPLICATIONS

This application is a National Stage of International Application No. PCT/JP2009/055777, filed on Mar. 24, 2009, which claims priority from Japanese Patent Application No. 2008-092302, filed on Mar. 31, 2008, the contents of all of which are incorporated herein by reference in their entirety.

TECHNICAL FIELD

The present invention relates to an organic semiconductor composition, an organic film that uses the same, and an organic film element, organic film transistor, organic electroluminescence element, electronic tag and liquid crystal display element provided with the organic film.

BACKGROUND ART

Organic film elements provided with an organic film composed of an organic semiconductor material are attracting attention as semiconductor elements provided with a semiconductor thin film. In the manufacturing of these organic semiconductor elements, since an organic film can be easily formed by coating an organic semiconductor material, there is the advantage of being able to inexpensively produce devices having a large surface area.

The properties of organic film elements are greatly dependent on the carrier transportability of the organic film, and the higher this carrier transportability, the greater the demonstration of superior properties as an organic film element. For example, in the case of an organic field effect transistor provided with a carrier transport layer composed of an organic film, the higher the carrier transportability of the organic film, the greater the current that is able to flow, and superior properties as a transistor, such as being able to increase the range of the adjustable amount of current, are obtained. Consequently, extensive studies are being conducted on organic semiconductor materials that allow the obtaining of high carrier transportability.

As an example of an attempt to obtain high carrier transportability, the following Patent Document 1 discloses a composition containing a lower molecular weight compound having an amine structure and a higher molecular weight compound, and an organic film and organic film transistor that use that composition.

In addition, as a similar attempt, the following Patent Document 2 discloses an organic semiconductor thin film containing crystalline grains of a crystalline, lower molecular weight organic semiconductor compound and an organic semiconductor component interposed in gaps between the crystal grains, and a production method thereof.

Patent Literature 1: International Publication No. WO 2004/057688

Patent Literature 2: Japanese Patent Application Laid-Open No. 2004-158710

DISCLOSURE OF THE INVENTION

Problem to be solved by the Invention

In recent years, however, cases requiring organic semiconductor materials to further improve carrier transportability have increased, and even in a composition like that of the above-mentioned Patent Document 1, it is still difficult to obtain carrier transportability to a degree that is able to satisfy such requirements.

On the other hand, the organic semiconductor thin film of Patent Document 2 is composed of crystal grains of a crystalline, low molecular weight organic semiconductor compound and an organic semiconductor component interposed in gaps between the crystal grains. However, the inventors of the present invention found that in this thin film, the crystal grains and the organic semiconductor component are not always connected satisfactorily. Even if the crystal grains and organic semiconductor component appear to be connected, high carrier transportability cannot be obtained if they have poor wettability or unable to satisfactorily carry out exchange of charge. In addition, in the formation method of a thin film described in Patent Document 2, in addition to apply a coating method in which an organic semiconductor thin film is produced from a solution and it being difficult to inexpensively manufacture devices having a large surface area, it tended to be difficult to obtain adequate carrier transportability with a single coating.

Therefore, with the foregoing in view, an object of the present invention is to provide an organic semiconductor composition that is able to form an organic film having high carrier transportability. In addition, an object of the present invention is to provide an organic film that uses this organic semiconductor composition, and an organic film element, and more specifically an organic film transistor, organic electroluminescence element, electronic tag and liquid crystal display element, provided with this organic film.

Means for Solving the Problem

In order to achieve the above-mentioned objects, the inventors of the present invention conducted studies while focusing on the mixed state when mixing two or more types of organic semiconductor materials. As a result, the compatibility of two or more types of organic semiconductor materials was found to greatly affect carrier transportability, thereby leading to completion of the present invention.

Namely, the organic semiconductor composition of the present invention contains a lower molecular weight compound and a higher molecular weight compound having carrier transportability, and a solubility parameter of the higher molecular weight compound and a solubility parameter of the lower molecular weight compound differ by 0.6 to 1.5.

In the case a higher molecular weight compound in the manner of the higher molecular weight compound having carrier transportability contained in the organic semiconductor composition of the present invention (to be referred to as a "carrier transporting higher molecular weight compound") is a solution and the like, it is easy to adjust viscosity regardless of the type thereof, and a uniform thin film can be formed easily by coating onto a glass substrate, silicon substrate or plastic substrate and the like. Although those higher molecular weight compounds that have liquid crystallinity or crystallinity tend to exhibit high carrier transportability, it has thus far been difficult to adequately extract their performance.

On the other hand, high carrier transportability can be demonstrated by selecting, for example, a compound having a satisfactorily broadened π-conjugated plane for the lower molecular weight compound like that contained in the organic semiconductor composition of the present invention. However, as a result of studies conducted by the inventors of the present invention, in the case of using these lower molecular weight compounds alone, it was determined to be extremely difficult to form an organic film having adequate carrier transportability.

This is because, since a lower molecular weight compound having a π-conjugated plane as described above tends to crystallize easily due to the nature of such compounds, the types of solutions in which it can be uniformly dissolved or dispersed are limited. Namely, in the case of using a solvent having superior solubility that enables it to dissolve a lower molecular weight compound, the possibility of the substrate and the like deteriorating or difficulty in controlling uniform drying after coating even if the substrate is able to be coated are thought to be factors that make it difficult to form a uniform thin film.

In contrast, the present invention uses a carrier transporting higher molecular weight compound in combination with a lower molecular weight compound. As was previously described, a higher molecular weight compound in the manner of a carrier transporting higher molecular weight compound enables viscosity to be adjusted easily regardless of the type thereof. Consequently, by combining a carrier transporting higher molecular weight compound with the above-mentioned lower molecular weight compound, adjustment of the viscosity of a solution and the like in which they are contained can be carried out easily. In addition, this carrier transporting higher molecular weight compound tends to enable a lower molecular weight compound to be satisfactorily dissolved or dispersed. Consequently, according to the combination of the present invention as described above, undesirable crystallization of the lower molecular weight compound during drying can be adequately inhibited.

Moreover, in the organic semiconductor composition of the present invention, the difference between solubility parameters of the carrier transporting higher molecular weight compound and the lower molecular weight compound is 0.6 to 1.5. Since these solubility parameters serve as an indicator of compatibility of the organic materials, mixed compounds typically tend to be more compatible the smaller the difference between their respective solubility parameters. In the present invention, by making this difference between solubility parameters to be within a specific range of 0.6 to 1.5, the carrier transporting higher molecular weight compound and the lower molecular weight compound do not separate in the case of being in the form of an organic film and the like, and can be put into a state in which they are not completely compatible, thereby resulting in the obtaining of high carrier transportability.

Thus, according to the organic semiconductor composition of the present invention that has a specific combination as described above, an organic film can be formed that has even more superior carrier transportability as compared with the case of using a carrier transporting higher molecular weight compound or lower molecular weight compound alone. As a result, since an organic film having a large surface area and uniform thickness as well as high carrier transportability can be easily formed by coating, and a wide range of substrates can be selected in the manufacturing thereof, various types of organic film elements can be manufactured.

In the organic semiconductor composition of the present invention, the carrier transporting higher molecular weight compound and the lower molecular weight are preferably contained by forming a sea-island structure. In addition, at least one of the carrier transporting higher molecular weight compound and the lower molecular weight compound has crystallinity. In this case, balance between the above-mentioned separation and compatibility becomes preferable, thereby facilitating the obtaining of even more superior carrier transportability.

In addition, an object of the present invention is to provide an organic film prepared by using the organic semiconductor composition of the present invention as previously described. Since such an organic film is composed of the organic semiconductor composition of the present invention, it has high carrier transportability as previously described.

This type of organic film preferably has a lower molecular weight compound distributed concentratedly at the surface of the organic film. As a result of the lower molecular weight compound being unevenly distributed on the surface thereof, the organic film is able to adequately demonstrate the carrier transportability possessed by the lower molecular weight compound.

If the organic film of the present invention is formed using the organic semiconductor composition of the present invention by vacuum deposition, spin coating, ink jet printing, dispenser printing, flexo printing, nozzle coating or capillary coating, since the resulting film has a large surface area and is uniform in addition to having high carrier transportability, devices having a large surface area are formed easily.

In addition, the present invention also provides an organic film element provided with the organic film of the present invention. An example of this type of organic film element is an organic film transistor provided with a source electrode and drain electrode, an organic semiconductor layer that serves as a current path between these electrodes, and a gate electrode that controls the amount of current that flows through this current path, in which the organic semiconductor layer is composed of the organic film of the present invention. In addition, the present invention provides an organic electroluminescence element and an electronic tag provided with this type of organic film transistor of the present invention.

These elements and the like are able to demonstrate high properties since an organic film having high carrier transportability obtained by using the organic semiconductor composition of the present invention as described above is provided as an organic semiconductor layer.

Effect of the Invention

According to the present invention, an organic semiconductor composition capable of forming an organic film having high carrier transportability, an organic film prepared by using the same, an organic film transistor provided with the organic film, and an organic electroluminescence element, electronic tag and liquid crystal display element provided with the organic film transistor, can be provided.

DESCRIPTION OF SYMBOLS

Figure 1:
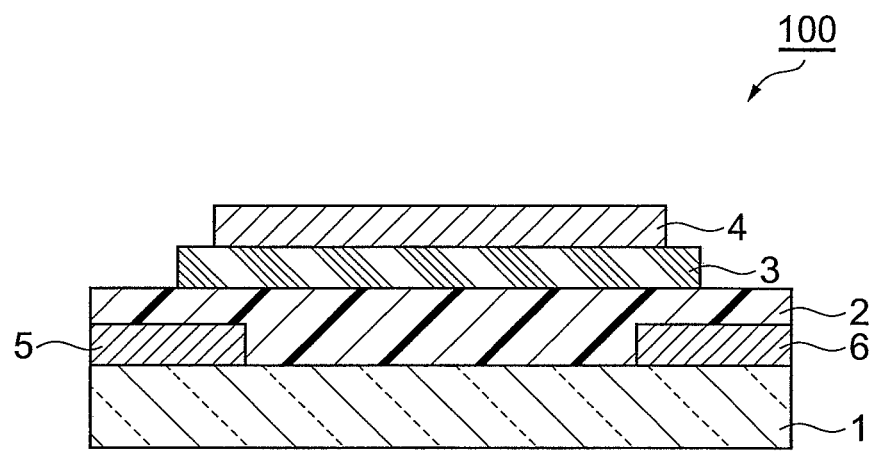
FIG. 1 is a schematic cross-sectional view of an organic film transistor relating to a first embodiment.

1: substrate, 2: organic semiconductor layer, 2a: organic semiconductor layer, 3: insulating layer, 4: gate electrode, 5: source electrode, 6: drain electrode, 7a: first electrode, 7b: second electrode, 8: load generating layer, 100: organic film transistor relating to first embodiment, 110: organic film transistor relating to second embodiment, 120: organic film transistor relating to third embodiment, 130: organic film transistor relating to fourth embodiment, 140: organic film transistor relating to fifth embodiment, 150: organic film transistor relating to sixth embodiment, 160: organic film transistor relating to seventh embodiment, 162: organic film transistor relating to a seventh embodiment in the case of employing a structure in which a gate electrode also serves as a substrate, 200: solar relating to an embodiment, 300: solar cell relating to a first embodiment, 310: optical sensor relating to a second embodiment, 320: optical sensor relating to a third embodiment.

BEST MODES FOR CARRYING OUT THE INVENTION

The following provides an explanation of preferred embodiments of the present invention while referring to the drawings as necessary. Furthermore, in the explanations of the drawings, the same reference symbols are used to indicate the same constituent members, and duplicate explanations thereof are omitted.

[Organic Semiconductor Composition]

The organic semiconductor composition of the present invention contains a carrier transporting higher molecular weight compound and a lower molecular weight compound, and a solubility parameter of the carrier transporting higher molecular weight compound and a solubility parameter of the lower molecular weight compound differ by 0.6 to 1.5.

First, an explanation is provided of a carrier transporting higher molecular weight compound contained in an organic semiconductor composition.

The carrier transporting higher molecular weight compound has carrier transportability and is preferably a compound that is able to satisfactorily dissolve or disperse a lower molecular weight compound. Here, carrier transportability refers to a property that allows carriers such as electrons or holes to migrate within a structure such as a film in the case of having formed that structure, and a carrier transporting higher molecular weight compound refers to a higher molecular weight compound having a structure or electron state capable of manifesting such carrier transportability. The weight average molecular weight of the carrier transporting higher molecular weight compound as polystyrene is preferably 8,000 or more and more preferably 10,000 to 1,000,000. From the viewpoint of superior carrier transportability in particular, the weight average molecular weight of the carrier transporting higher molecular weight compound as polystyrene is preferably 30,000 to 400,000 and more preferably 40,000 to 360,000. In addition, the number average molecular weight of the carrier transporting higher molecular weight compound as polystyrene is preferably 17,500 to 90,000, more preferably 18,000 to 90,000, even more preferably 20,000 to 90,000 and particularly preferably 20,000 to 87,000.

A higher molecular weight compound having a conjugated unsaturated structure is preferable for the carrier transporting higher molecular weight compound. This higher molecular weight compound having a conjugated unsaturated structure has a plurality of at least one type of structural unit containing alone or in combination a structure selected from the group consisting of, for example, a structure containing a double bond, a structure containing a triple bond, an aromatic structure and a tertiary arylamine structure, as a repeating unit, and is composed by a homopolymer or copolymer in which conjugation is in a stretched state overall. Furthermore, a copolymer may be a random copolymer or block copolymer in the case of a copolymer.

An ethylene structure is an example of a structure containing a double bond. Here, an "ethylene structure" refers to a structure forming ethylene in which two bonds used for bonding with other structural units are substituted with hydrogen atoms. Furthermore, the same definition is applied in explanations of each of the following structures. In addition, an acetylene structure is an example of a structure containing a triple bond.

Moreover, examples of aromatic structures include mononuclear or polynuclear aromatic hydrocarbon structures and mononuclear or polynuclear heterocyclic structures. Examples of mononuclear or polynuclear aromatic hydrocarbon structures include a phenylene structure, naphthalene structure, fluorene structure, acenaphthalene structure, phenanthrene structure, anthracene structure, fluoranthene structure, pyrene structure, perylene structure, rubrene structure, chrysene structure, and multinuclear condensed compound structures in which rings composing these structures are condensed.

Specific examples of such mononuclear or polynuclear aromatic hydrocarbon structures include structures represented by the following formulas (9a) to (9f). Those structures having a fluorene structure as in the following formulas (9a) and (9b) are particularly preferable. Furthermore, bonds that are not indicated with substituents in the following formulas refer to bonds that form bonds with other structural units.

[C1]

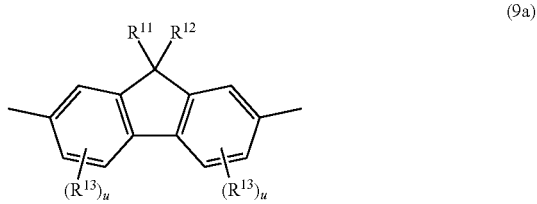

(9a)

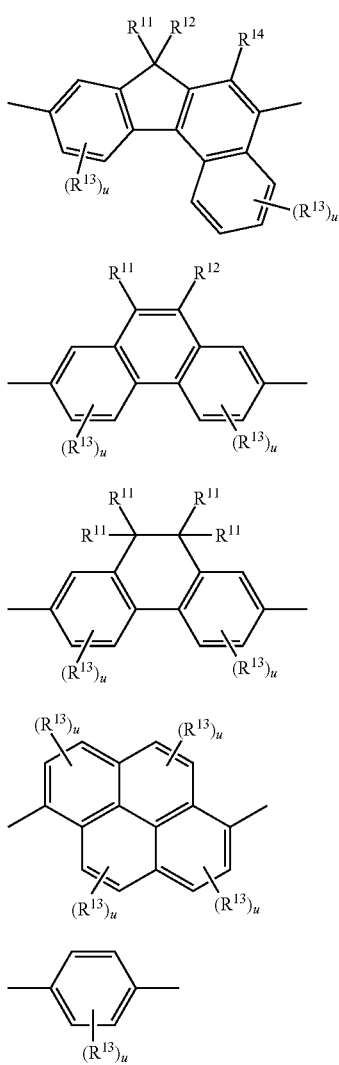

In the above formulas (9a) to (9f), $R^{11}$, $R^{12}$ and $R^{14}$ are respectively and independently a hydrogen atom, halogen atom or monovalent group, and $R^{13}$ is a halogen atom or monovalent group. In addition, u is an integer of 0 or more. Examples of halogen atoms and monovalent groups are the same as those listed as example of $R^1$ and $R^2$ in the subsequently described formula (1). Furthermore, in the case a plurality of $R^{11}$ or $R^{13}$ is contained in a molecule, the plurality of $R^{11}$ and $R^{13}$ may be respectively the same or different. In addition, in the case two types of $R^{11}$, $R^{12}$, $R^{13}$ and $R^{14}$ or two $R^{11}$ or two $R^{13}$ in the same molecule are bonded to the same carbon atom or to adjacent carbon atoms, the groups in this relationship may also form a ring by bonding with portions thereof. A ring formed in this case may be a single ring or condensed ring or a hydrocarbon ring or heterocyclic ring. In addition, these rings may also have substituents. In particular, a monocyclic hydrocarbon ring and a monocyclic heterocyclic ring containing an oxygen atom or sulfur atom as a heteroatom are preferable.

On the other hand, among the mononuclear or polynuclear heterocyclic structures, examples of mononuclear heterocyclic structures include 5-membered heterocyclic structures such as a furan structure, thiofuran structure, pyrrole structure, silole structure, oxazole structure, isoxazole structure, thiazole structure, isothiazole structure, imidazole structure, oxadiazole structure, thiadiazole structure or pyrazole structure. In addition, examples of 6-membered heterocyclic structures include a pyridine structure, pyridazine structure, pyrimidine structure, pyrazine structure, triazine structure and tetrazene structure.

Examples of polynuclear heterocyclic structures include benzo condensed ring structures such as a benzoxazole structure, benzothiazole structure, benzimidazole structure, quinoline structure, isoquinoline structure, cinnoline structure, quinazoline structure, phthalazine structure, benzothiadiazole structure or benzotriazine structure. In addition, other examples include polynuclear condensed ring structures such as a phenazine structure, phenanthridine structure, acridine structure, carbazole structure, dibenzofuran structure, dibenzothiophene structure, dibenzosilole structure, diphenylene oxide structure, thienothiophene structure, thiazolothiazole structure, dithienothiophene structure, benzo(bis)thiophene structure or benzo(bis)thiazole structure. Moreover, condensed ring structures in which a plurality of the above-mentioned mononuclear or polynuclear heterocyclic structures are bonded are also preferable.

Examples of such mononuclear or polynuclear heterocyclic structures include the structures represented by the following formulas (10a) to (10o) and condensed structures in which a plurality thereof are bonded. In particular, structures represented by the following formula (10a) and condensed structures in which a plurality of these structures are bonded are preferable, while thiophene structures and condensed thiophene structures, in which Z is a sulfur atom, are particularly preferable. Furthermore, in the following formulas, bonds that are not indicated with substituents refer to bonds that form bonds with other structural units.

[C2]

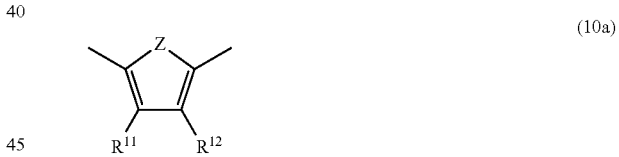

(10a)

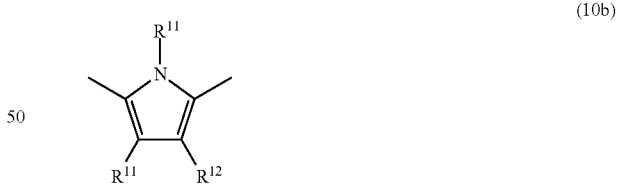

(10b)

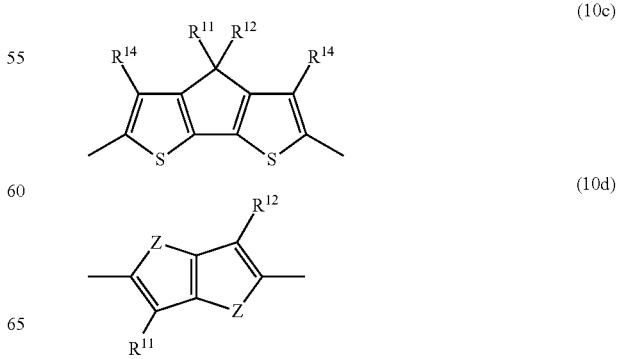

(10c)

(10d)

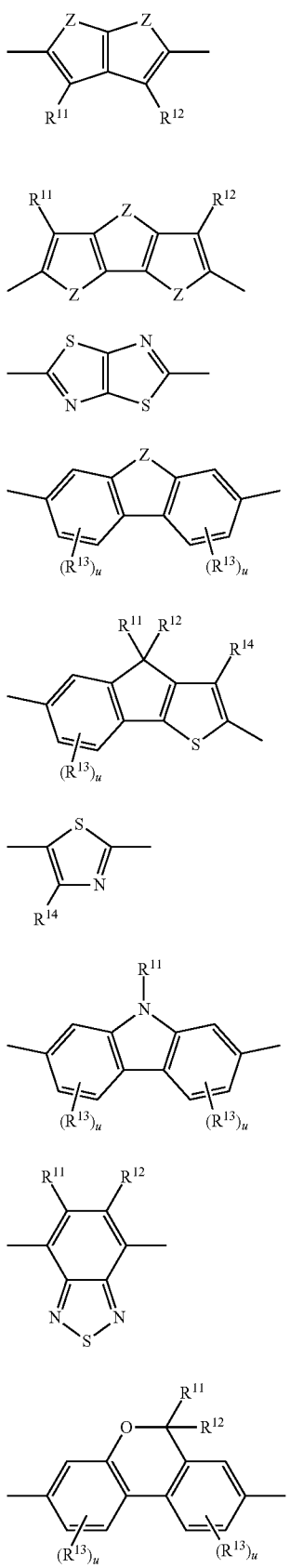

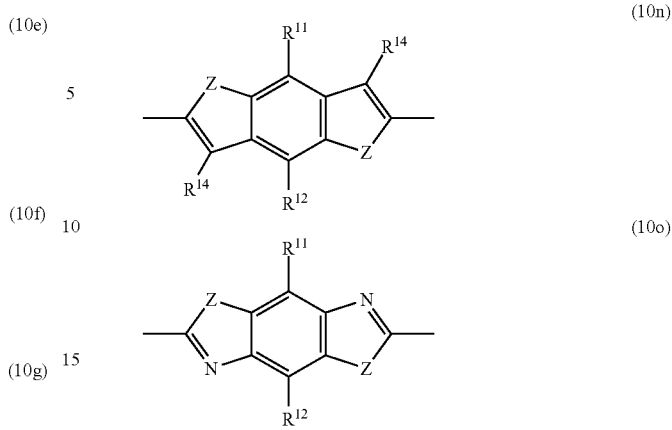

In the above formulas (10a) to (10o), $R^{11}, R^{12}, R^{13}, R^{14}$ and u are the same as in the case of the above formulas (9a) to (9o). In addition, Z is a heteroatom such as an oxygen atom, sulfur atom, nitrogen atom, phosphorous atom, boron atom or silicon atom. Moreover, $R^{14}$ may be the same or different in the case of a plurality thereof.

Moreover, examples of tertiary arylamine structures include a triphenylamine structure, N,N'-diphenylbenzidine structure, N,N'-1,4-phenylenediamine structure and diphenylnaphthylamine structure, and in particular, examples of crosslinked tertiary arylamine structures include an N-phenylphenoxazine structure and N-phenylphenothiazine structure.

The carrier transporting higher molecular weight compound is preferably a polymer having a repeating unit containing the above-mentioned structures either alone or in a combination of a plurality thereof. In the case of having a plurality of the repeating units in combination, a structure may be contained in which a single repeating unit is continuous.

In addition, in the case the repeating unit is only composed of a mononuclear or polynuclear aromatic hydrocarbon structure, mononuclear or polynuclear heterocyclic structure or tertiary arylamine structure, and the structure adjacent to these repeating units is not an ethylene structure or acetylene structure, the carbon atom adjacent to the carbon atom to which the bond with the adjacent structural unit is bonded is preferably not substituted (namely, has a hydrogen atom) or is substituted by a halogen atom. Such substitution conditions are particularly preferably satisfied in the case of a repeating unit composed of a mononuclear or polynuclear aromatic hydrocarbon structure and the adjacent structure is not an ethylene structure or acetylene structure.

Moreover, the portion in each repeating unit that is bonded to an adjacent repeating unit is particularly preferably a 5-membered ring structure. Namely, a repeating unit formed only by a mononuclear aromatic hydrocarbon structure or mononuclear heterocyclic structure is preferably a 5-membered ring structure. If each repeating unit satisfies any one or a plurality of the above conditions, a conjugated unsaturated structure is satisfactorily formed, and carrier transportability of the carrier transporting higher molecular weight compound tends to be more satisfactory.

A carrier transporting higher molecular weight compound having repeating units thereof in a combination represented by the following Table 1 or Table 2 ((11a) to (11l)) is particularly preferable as a carrier transporting higher molecular weight compound as described above. Furthermore, Table 1 refers to combining repeating units arranged in the same row, and a block represented with a "-" indicates that there is no combined repeating unit. In addition, the symbols used in the formulas in the table have the same meanings as those previously described. Furthermore, in the case there is a plurality of each of $R^{11}$, $R^{12}$, $R^{13}$ and $R^{14}$ in a molecule of the compounds in the table, each of these may be the same or different.

TABLE 1

| Carrier Transporting Higher molecular weight compound | Combination of Repeating Units | | |
|---|---|---|---|
| (11a) | [fluorene structure with $R^{11}$, $R^{12}$, $(R^{13})_u$] | — | — |
| (11b) | [fluorene structure with $R^{11}$, $R^{12}$, $(R^{13})_u$] | [bithiophene-type Z structure with $R^{11}$, $R^{12}$] | — |
| (11c) | [fluorene structure with $R^{11}$, $R^{12}$, $(R^{13})_u$] | [triarylamine structure with $(R^{13})_u$] | — |
| (11d) | [fluorene structure with $R^{11}$, $R^{12}$, $(R^{13})_u$] | [Z heterocycle with $R^{11}$, $R^{12}$] | Ethylene |
| (11e) | [dithienocyclopentadiene with $R^{11}$, $R^{12}$, $R^{14}$] | [Z heterocycle with $R^{11}$, $R^{12}$] | — |
| (11f) | [dithienocyclopentadiene with $R^{11}$, $R^{12}$, $R^{14}$] | [benzothiadiazole with $R^{11}$, $R^{12}$] | — |

TABLE 2

| Carrier Transporting Higher molecular weight compound | Combination of Repeating Units | | |
|---|---|---|---|
| (11g) | structure with Z, R¹¹, R¹² | — | — |
| (11h) | structure with Z, R¹¹, R¹² | structure with Z, R¹¹, R¹² | — |
| (11i) | structure with Z, R¹¹, R¹² | structure with Z, Z, R¹¹, R¹² | — |
| (11j) | structure with Z, R¹¹, R¹², R¹⁴ | — | — |
| (11k) | structure with Z, R¹¹, R¹², R¹⁴ | structure with Z, R¹¹, R¹² | — |
| (11l) | structure with S, N | structure with Z, R¹¹, R¹² | — |

Polymers like those shown in the following Tables 3 and 4 are preferable as carrier transporting higher molecular weight compounds having the combinations of (11a) to (11l) as described above. Furthermore, m in Table 3 is respectively an integer of 1 or more. The range of this m is preferably a range at which the weight average molecular weight (as polystyrene) of the polymer is 8,000 or more, and more preferably a range at which the weight average molecular weight (as polystyrene) of the polymer is 10,000 to 1,000,000. From the viewpoint of superior carrier transportability in particular, the range of m is preferably a range at which the weight average molecular weight as polystyrene of the carrier transporting higher molecular weight compound is 30,000 to 400,000, and more preferably a range at which the weight average molecular weight as polystyrene of the carrier transporting higher molecular weight compound is 40,000 to 360,000. In addition, the range of m is preferably a range at which the number average molecular weight as polystyrene of the carrier transporting higher molecular weight compound is 17,500 to 90,000, more preferably a range at which the number average molecular weight as polystyrene of the carrier transporting higher molecular weight compound is 18,000 to 90,000, and still more preferably 20,000 to 90,000, and particularly preferably a range at which the number average molecular weight as polystyrene of the higher molecular weight compound is 20,000 to 87,000.

TABLE 3
| Combination | Polymer |
|---|---|
| (11a) | 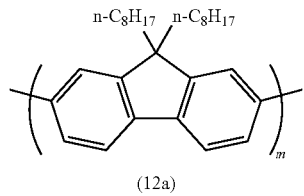 (12a) |
| | 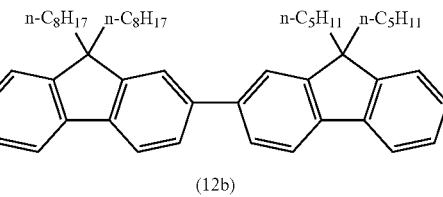 (12b) |
| (11b) | 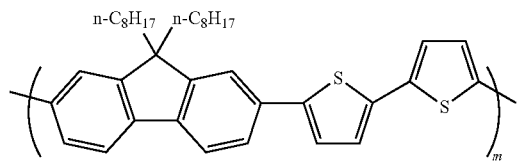 (12c) |
| (11c) | 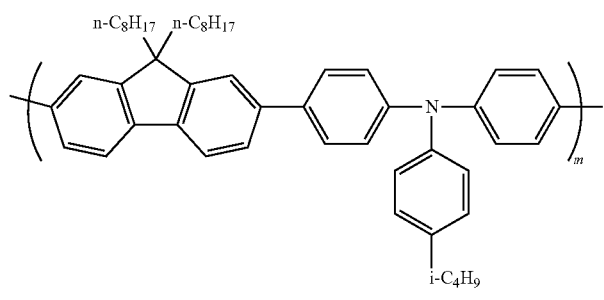 (12d) |
| | 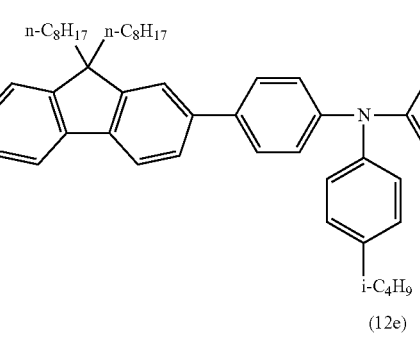 (12e) |
| (11d) | 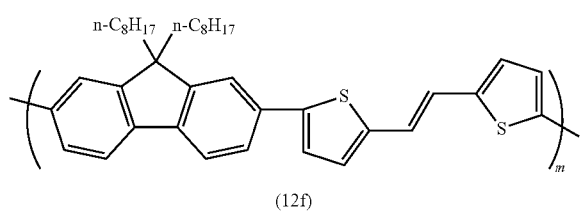 (12f) |

TABLE 3-continued
| Combination | Polymer |
|---|---|
| (11e) | 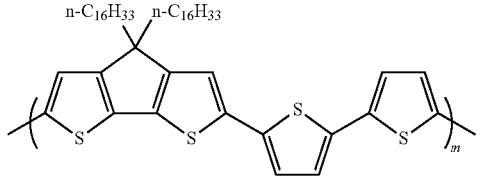 (12g) |
| (11f) | 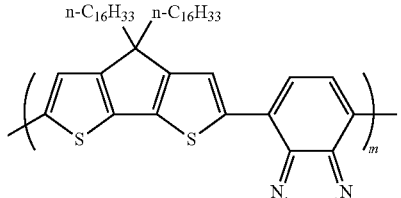 (12h) |
TABLE 4
| Combination | Polymer |
|---|---|
| (11g) | 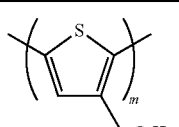 (12i) |
| | 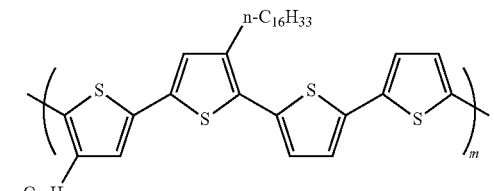 (12j) |
| (11h) | 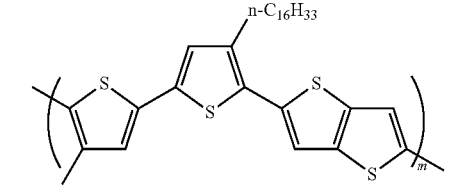 (12k) |
| | 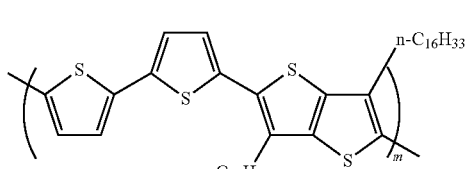 (12l) |

TABLE 4-continued

| Combination | Polymer |
|---|---|
| (11i) | 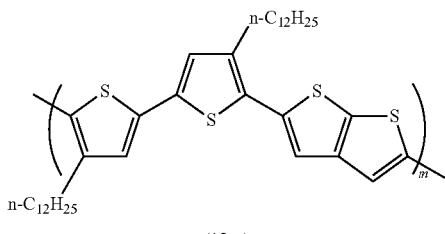 (12m) |
| (11j) | 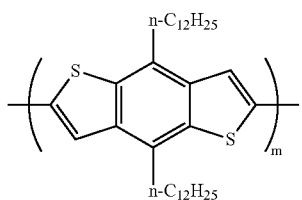 (12n) |
| (11k) | 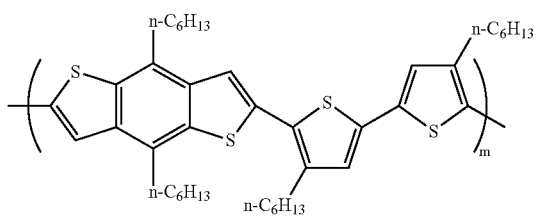 (12o) |
| (11l) | 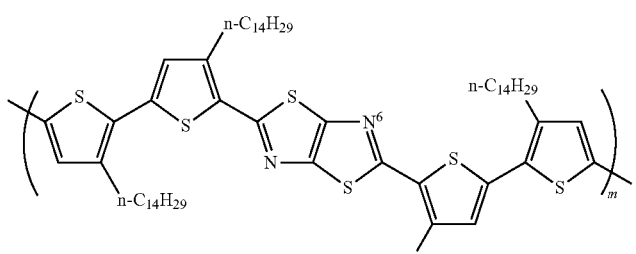 (12p) |

Furthermore, although the above description has not particularly provided an explanation of the terminal structure of the carrier transporting higher molecular weight compound, from the viewpoint of adequately obtaining properties and durability when in the form of an organic film element that uses an organic film composed of an organic semiconductor composition, the terminal structure is preferably a stable structure. Thus, in the case, for example, a polymer as described above has an unstable terminal structure, it is preferable to substitute the unstable group with a more stable group or protect the unstable group.

In addition to hydrogen atoms and fluorine atoms, examples of stable terminal groups include monovalent groups such as an saturated or unsaturated hydrocarbon group, aryl group, heteroaryl group, alkoxy group, amino group, carbonyl group, nitro group, hydroxy group, cyano group, arylalkyl group, heteroarylalkyl group, aryloxy group, heteroaryloxy group or alkylsilyl group. These monovalent groups may further have an arbitrary substituent, and examples of substituents include those listed as examples of the terminal groups described above.

From the viewpoint of enhancing solubility of the carrier transporting higher molecular weight compound in an organic solvent and the like and simplifying coating and the like of the organic semiconductor composition, the terminal group is preferably a saturated or unsaturated hydrocarbon group, alkoxy group, or saturated or unsaturated hydrocarbon group or alkoxy group in which a portion or all of the hydrogen atoms are substituted by fluorine atoms. In addition, the terminal group is also preferably that which has a conjugated structure that is continuous with a main chain that forms a conjugated structure of the carrier transporting higher molecular weight compound, for example. Examples of such terminal groups include those containing an aryl group or heteroaryl group (heterocyclic group) that is bonded to the main chain through a carbon-carbon bond. Furthermore, in the case a plurality of terminal groups are present in the higher molecular weight compound, each group may be the same or different.

Next, an explanation is provided of the lower molecular weight compound contained in the organic semiconductor composition.

Examples of lower molecular weight compounds that are preferable for the organic semiconductor composition include lower molecular weight compounds having a π-conjugated structure and polycyclic aromatic compounds. Examples of lower molecular weight compounds having a π-conjugated structure include compounds having a structure similar to the above-mentioned carrier transporting higher molecular weight compound in which the weight average molecular weight as polystyrene is less than 8,000.

On the other hand, examples of polycyclic aromatic compounds include naphthalene, anthracene, tetracene, rubrene, pentacene, benzopentacene, dibenzopentacene, tetrabenzopentacene, naphthopentacene, hexacene, heptacene, nonacene, fluorene, fluoranthene, phenanthrene, chrysene, triphenylene, tetraphene, picene, flumilene, tetraphene, pyrene, anthanthrene, peropyrene, coronene, benzocoronene, dibenzocoronene, hexabenzocoronene, benzodicoronene, perylene, terylene, diperylene, quoterylene, trinaphthylene, heptaphene, ovalene, rubicene, violanthrone, isoviolanthrone, circumanthracene, bisanthene, zethrene, heptazethrene, pyranthrene, kekulene, truxene and derivatives thereof. In addition, other examples include fullerene (such as C60, C70, C60-PCBM or C70-PCBM) and derivatives thereof.

The polycyclic aromatic compound may contain a heteroatom. Examples of polycyclic aromatic compounds containing a heteroatom include benzodithiophene, naphthodithiophene, anthradithiophene, tetradithiophene, pentadithiophene, hexadithiophene, dibenzothiophene, dibenzothienodibenzothiophene, thienothiophene, dithithienothiophene, tetrathienoacene, pentathienoacene, dibenzofuran, carbazole, dibenzosilole, benzodithiazole, naphthodithiazole, anthradithiazole, tetradithiazole, pentadithiazole hexadithiazole, thiazolothiazole, tetrathiafulvalene, dibenzothiafulvalene, dithiophene thiafulvalene, tetracyanoquinodimethane, tetracyanonaphthoquinodimethane, naphthalene tetracarboxylic diimide, perylene tetracarboxylic diimide and derivatives thereof. In addition, other examples include phthalocyanine, porphyrin, tetrabenzoporphyrin and derivatives thereof (including metal-containing derivatives). Moreover, additional examples include triphenylamine and derivatives thereof.

Examples of the above-mentioned derivatives include derivatives in which substituents indicated for the carrier transporting higher molecular weight compound have been introduced. For example, an example of a derivative of tetracene is rubrene. Other examples include their quinone derivatives, such as pentacenedione as a derivative of pentacene.

A polycyclic aromatic compound is preferable for the lower molecular weight compound, and more specifically, compounds represented by the following formula (1) are preferable.

[C3]

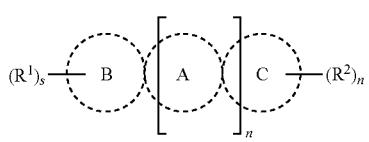

(1)

In the above formula (1), A, B and C respectively represent a ring structure, and A and B, and A and C are mutually condensed. Here, "mutually condensed" refers to a portion of the bonds that form one of the ring structures also form a portion of the other ring structures. Examples of ring structures represented by A, B and C respectively and independently include a benzene ring, 6-membered heterocyclic ring, 5-membered heterocyclic ring and cyclopentadiene ring. These rings may also have substituents.

In addition, from the viewpoint of carrier transportability, n, which represents the number of repetitions of the ring represented by A, is an integer of 2 to 8, preferably an integer of 2 to 6, and more preferably an integer of 2 to 4.

Here, among the rings represented by A, B and C, a 5-membered heterocyclic ring refers to that having a structure in which at least one of the hydrogen atoms of a 5-membered ring composed of carbon atoms is substituted by a heteroatom such as an oxygen atom, sulfur atom, nitrogen atom, phosphorous atom, boron atom or silicon atom.

A benzene ring that may have a substituent, a thiophene ring, a selenophene ring or a cyclopentadiene ring that may have a substituent is preferable for the ring that composes A. Furthermore, in the case of having a plurality of rings represented by A, the plurality of A may each be the same or different. In this case, at least one of the plurality of A is preferably a 5-membered heterocyclic ring, and in the case the ring that composes A is selected from the above-mentioned combinations, the 5-membered heterocyclic ring is a thiophene ring or selenophene ring. On the other hand, the rings represented by B and C are respectively and independently preferably a benzene ring that may have a substituent.

At least one of the rings represented by A is preferably a 5-membered heterocyclic ring, and in this case, the heterocyclic ring is a thiophene ring or selenophene ring. In particular, a benzene ring that may have a substituent or a thiophene ring is preferable for A, and the 5-membered heterocyclic ring contained in at least one thereof is a thiophene ring. If at least one thiophene ring is possessed for A, a polycyclic aromatic compound is obtained that is able to demonstrate high carrier transportability.

Furthermore, the substituent that may be substituted in the above-mentioned rings is preferably a substituent that is preferable for $R^5$ or $R^6$ and the like to be subsequently described.

In addition, the following groups are preferable as monovalent groups in $R^1$ and $R^2$ in the above-mentioned formula (1). Namely, examples thereof include saturated hydrocarbon groups, unsaturated hydrocarbon groups, aryl groups, heteroaryl groups, alkoxy groups, amino groups, carbonyl groups, nitro groups, hydroxy groups, cyano groups, arylalkyl groups, heteroarylalkyl groups, aryloxy groups, heteroaryloxy groups and alkylsilyl groups. These monovalent groups may be further substituted by substituents, and examples of those substituents include groups represented by $R^1$ and $R^2$.

Among the above-mentioned groups, a saturated hydrocarbon group having 1 to 20 carbon atoms is preferable and that having 1 to 16 carbon atoms is more preferable for the saturated hydrocarbon group. In addition, this saturated hydrocarbon group may be linear or branched. Examples of such saturated hydrocarbon groups include a methyl group, ethyl group, n-propyl group, isopropyl group, n-butyl group, isobutyl group, sec-butyl group, tert-butyl group, n-pentyl group, n-hexyl group, n-heptyl group, n-octyl group, n-nonanyl group, n-decyl group, n-undecyl group, n-dodecyl group, n-tridecyl group, n-tetradecyl group, n-pentadecyl group, n-hexadecyl group, n-heptadecyl group, n-octadecyl group, n-nonadecyl group and n-eicosanyl group.

An unsaturated hydrocarbon group having 1 to 20 carbon atoms is preferable and that having 1 to 16 carbon atoms is more preferable for the unsaturated hydrocarbon group. This unsaturated hydrocarbon group may be linear or branched. Examples of such unsaturated hydrocarbon groups include a vinyl group, 1-propenyl group, allyl group, propargyl group, isopropenyl group, 1-butenyl group and 2-butenyl group. From the viewpoint of chemical stability, an unsaturated hydrocarbon group in which the number of units of double bonds or triple bonds in a chain thereof is preferable for the unsaturated hydrocarbon group.

That in which the number of carbon atoms of the alkoxy group is 1 to 20 is preferable and that in which the number of carbon atoms of the alkoxy group is 1 to 16 is more preferable for the above-mentioned alkoxy group. The alkoxy group may be linear or branched.

An aromatic hydrocarbon group having 6 to 60 carbon atoms is preferable and an aromatic hydrocarbon group having 6 to 20 carbon atoms is more preferable for the above-mentioned aryl group. Examples of aromatic hydrocarbon groups include a benzene ring, fluorene ring, naphthalene ring and anthracene ring.

An aromatic heterocyclic group having 4 to 60 carbon atoms is preferable and an aromatic heterocyclic group having 4 to 20 carbon atoms is more preferable for the above-mentioned heteroaryl group. Here, a heterocyclic ring that composes the aromatic heterocyclic group refers to that having a structure in which at least one of the carbon atoms that compose the cyclic structure composed of carbon atoms is substituted by a heteroatom such as an oxygen atom, sulfur atom, nitrogen atom, phosphorous atom, boron atom or silicon atom, and this cyclic structure has aromatic properties. Examples of this heterocyclic ring include a thiophene ring, selenophene ring and furan ring.

The above-mentioned arylalkyl group or aryloxy group is preferably that in which the aryl motif is composed of an aromatic hydrocarbon group and the number of carbon atoms of this motif is preferably 6 to 60 and more preferably 6 to 20. In addition, the number of carbon atoms of the alkyl motif in an arylalkyl group is preferably 1 to 20 and more preferably 1 to 10.

The above-mentioned heteroarylalkyl group or heteroaryloxy group is preferably that in which the heteroaryl motif is composed of an aromatic heterocyclic group, and the number of hydrocarbons of that motif is preferably 4 to 60 and more preferably 4 to 20. In addition, the number of carbons of the alkyl motif of a heteroarylalkyl group is preferably 1 to 20 and more preferably 1 to 10.

In addition, examples of halogen atoms represented by $R^1$ and $R^2$ in the above-mentioned formula (1) include a fluorine atom, chlorine atom, bromine atom and iodine atom.

Moreover, s and t, which respectively represent the number of substitutions by groups represented by $R^1$ and $R^2$, are respectively and independently an integer of 0 to 4. However, in the case s or t is 2 or more, a plurality of $R^1$ and $R^2$ may each be the same or different.

The polycyclic aromatic compounds represented by the following formulas (2), (3), (4), (5), (6) and (7) are preferable as polycyclic aromatic compounds having such structures.

[C4]

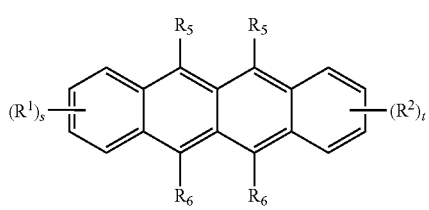

(2)

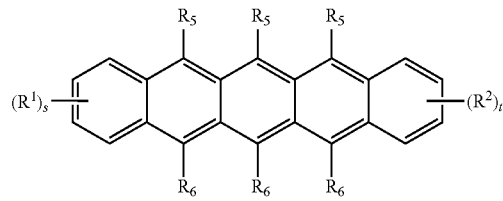

(3)

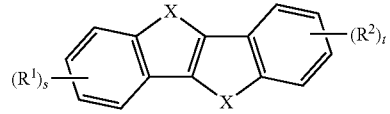

(4)

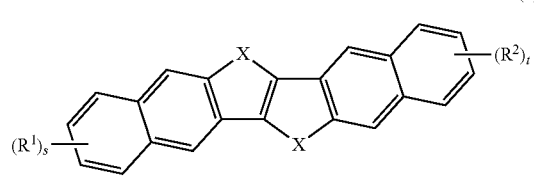

(5)

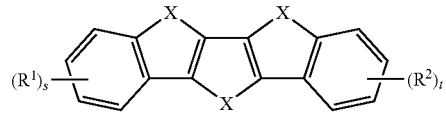

(6)

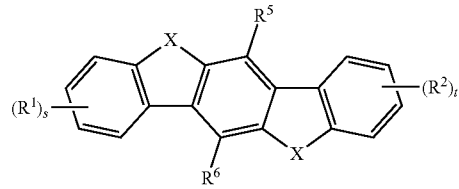

(7)

In the above formulas (2) to (7), $R^1$, $R^2$, s and t respectively have the same meanings as in the case of formula (1). X is a heteroatom, a group represented by the following formula (c) or a group represented by the following formula (d), and a plurality of X in a molecule may each be the same or different. However, from the viewpoint of simplifying production of formulas (2) to (7), X in each of the compounds is preferably the same group in all cases. In addition, $R^5$ and $R^6$ are respectively and independently a hydrogen atom, halogen atom or monovalent group.

[C5]

(c)

(d)

Examples of monovalent groups and halogen atoms in the above-mentioned $R^5$ and $R^6$ include the same groups as in the case of $R^1$ and $R^2$ in formula (1).

In the above formulas (c) and (d), $R^7$ and $R^8$ are respectively and independently a hydrogen atom, halogen atom or monovalent group. The monovalent group and halogen group are preferably the same groups as the above-mentioned $R^5$ and R⁶. R⁷ and R⁸ may also form a ring by bonding with portions thereof. In the case R⁷ and R⁸ form a ring, the ring may be a single ring or condensed ring or may be a hydrocarbon ring or heterocyclic ring. In addition, these rings may also have substituents. In particular, a single hydrocarbon ring or a single heterocyclic ring containing an oxygen atom or sulfur atom as a heteroatom is preferable for the ring formed by R⁷ and R⁸.

More specifically, compounds represented by the following formulas (8a) to (8i) are preferable as polycyclic aromatic compounds.

[C6]

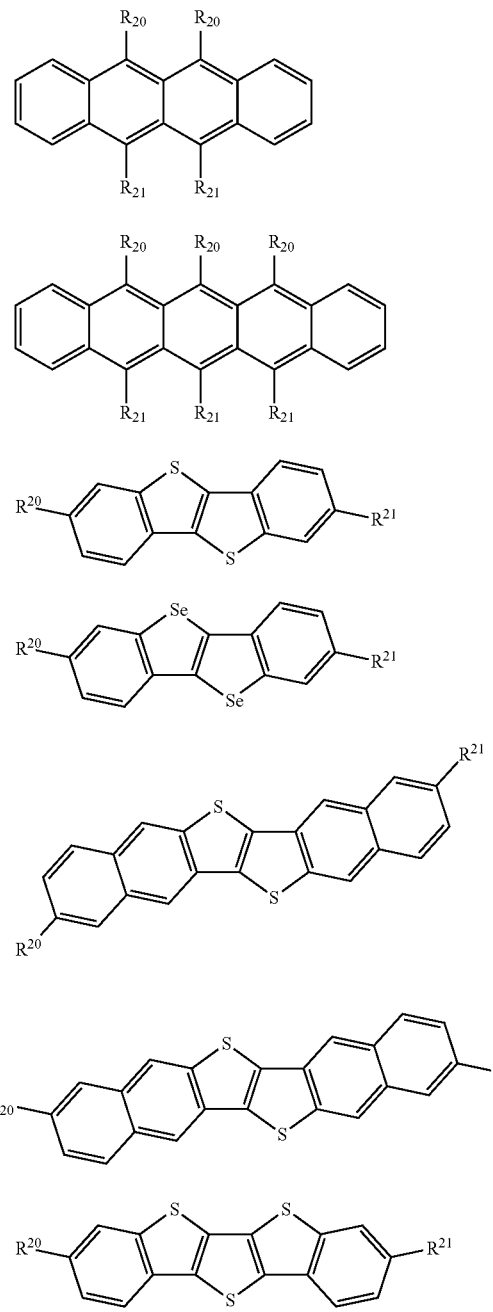

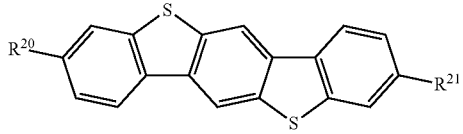

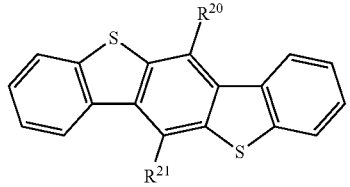

In the above formulas (8a) to (8i), $R^{20}$ and $R^{21}$ are respectively and independently a hydrogen atom, saturated hydrocarbon group having 1 to 16 carbon atoms, triisopropylsilylethynyl group, phenyl group or phenyl group substituted with a saturated hydrocarbon group having 1 to 16 carbon atoms, and a saturated hydrocarbon group and triisopropylsilylethynyl group are preferable. In particular, a compound represented by formula (8c), which is typically referred to as BTBT, is preferable as a polycyclic aromatic compound since it is able to demonstrate high carrier transportability. Furthermore, if $R^{20}$ and/or $R^{21}$ is a phenyl group or phenyl group substituted with a saturated hydrocarbon group having 1 to 16 carbon atoms, it is preferable depending on the application since there are cases in which it is able to raise the melting point of the BTBT.

Although the organic semiconductor composition of the present invention contains a combination of a carrier transporting higher molecular weight compound and a lower molecular weight compound as previously described, it may be a two-constituent composition containing one type each of the carrier transporting higher molecular weight compound and lower molecular weight compound, or may be a composition containing two or more types each of one or both components.

The proportion of the lower molecular weight compound is preferably 10 to 90% by weight, more preferably 45 to 75% by weight and even more preferably 50 to 70% by weight of the total weight of the carrier transporting higher molecular weight compound and the lower molecular weight compound. If the proportion of the lower molecular weight compound is outside the above range, the effect of improving carrier transportability in the organic semiconductor composition tends to decrease as compared with the case of being within the above range. In addition, in the case the proportion of the polycyclic aromatic compound is excessively large, there are cases in which formation of an organic film is difficult.

In the organic semiconductor composition of the present invention, the difference between solubility parameters of the carrier transporting higher molecular weight compound and the lower molecular weight compound is 0.6 to 1.5, preferably 0.8 to 1.3 and more preferably 0.9 to 1.25.

Here, "solubility parameter" in the present description refers to a value defined in the manner described below. Namely, solubility parameter (SP) is the value defined by the regular solution theory introduced by Hildebrand. This solubility parameter serves as an indicator of solubility of a two-component solution.

Since the regular solution theory is modeled on the basis of the force that acts between a solvent and solute consisting only of intermolecular force, interactions that cause liquid molecules to cohere can be considered to consist only of intermolecular forces. Here, since the cohesive energy of a liquid is equivalent to exothermic enthalpy, the solubility parameter is defined from the molar heat of vaporization $\Delta H$ and the molar volume V as $\delta=\sqrt{\Delta H/V-RT}$. Namely, the solubility parameter is calculated from the square root of the heat of vaporization required to vaporize a unit volume of liquid $(J/cm^3)^{1/2}$.

Furthermore, a liquid is rarely a regular solution, forces other than intermolecular force such as hydrogen bonding also act between solvent and solute molecules, and in actuality, whether or not two components mix or undergo phase separation is determined thermodynamically by the difference between the mixing enthalpy and mixing entropy of those components. However, substances having similar solubility parameters actually have a tendency to mix easily, and the organic semiconductor composition of the present invention allows the obtaining of superior carrier transportability by suitably adjusting the difference in solubility parameters between two components.

The following provides a more detailed explanation of a preferable example of a method for calculating the solubility parameters of the carrier transporting higher molecular weight compound and the lower molecular weight compound.

Namely, first with respect to the carrier transporting higher molecular weight compound, the length of a single molecular chain is assumed to be about the length of 8 benzene rings, and is assumed to be an assembly of 5 molecular chains. In addition, the lower molecular weight compound is assumed to be an assembly of 30 molecules. Three assembly models each, in which each compound is randomly arranged in a three-dimensional cell and which has a density of 0.3 to 0.5, are generated and these models are used as initial models.

Next, after structurally optimizing each compound for the three initial models, 2,500,000 steps (1 step=1 fs) of molecular dynamics calculations are carried out by NPT ensemble at a temperature of 298°K. and pressure of 1 atm. After confirming that energy, cell volume and the like are at equilibrium, the volume is fixed, 500,000 steps (1 step=1 fs) of molecular dynamics calculations are carried out by NVT ensemble at a temperature of 298°K., and sampling is carried out every 500 steps. Furthermore, during the 2,500,000 steps of calculations by NPT ensemble, in the case equilibrium is not reached due to large variations in energy or cell volume and the like, calculations are extended for an additional 50,000 steps followed by proceeding with NVT ensemble calculations once equilibrium has been confirmed to have been reached.

The solubility parameter of each model (square root of cohesive energy density) is then determined using the average value of 1000 pieces of data sampled during the NVT ensemble calculations, followed by determining the solubility parameter of each compound using the average value of calculated values from the three different initial models.

Conditions of these molecular dynamics calculations can consist of using a compass for the force field, using a cutoff value of 10 Å, using a high-speed scaling method for the temperature control method, and using the Berendsen method for the pressure control method. In addition, molecular dynamics calculations can be carried out using, for example, Discover available from Accelrys, Inc.

In the case the organic semiconductor composition of the present invention, which contains the above-mentioned carrier transporting higher molecular weight compound and the lower molecular weight compound and in which the difference between the solubility parameters thereof is within a specified range, has formed a organic film to be described later in particular, the carrier transporting higher molecular weight compound and the lower molecular weight compound preferably form a sea-island structure. Here, a sea-island structure refers to a structure in which the carrier transporting higher molecular weight compound and the lower molecular weight compound are in a somewhat organized state, and are dispersed such that regions formed from each compound are mixed. As a result of such a sea-island structure being formed, the properties possessed by the carrier transporting higher molecular weight compound and lower molecular weight compound alone are adequately maintained, and superior carrier transportability is obtained.

In addition, in the organic semiconductor composition, at least one of the carrier transporting higher molecular weight compound and the lower molecular weight compound preferably has crystallinity, and both compounds may also have crystallinity. As a result of these compounds having crystallinity, a satisfactory degree of orientation is easily obtained, thereby tending to facilitate the obtaining of even more superior carrier transportability.

[Organic Film]

Next, an explanation is provided of an organic film obtained by using the previously described organic semiconductor composition.

The organic film of the present invention is a thin film composed by the organic semiconductor composition of the present invention, and solvents used during production as well as other unavoidable components may be contained in a portion thereof. The thickness of the organic film is preferably about 1 nm to 100 μm, more preferably about 2 to 1000 nm, even more preferably about 5 to 500 nm and particularly preferably about 20 to 200 nm. According to an organic film having such thickness, an organic film element having satisfactory carrier transportability and adequate strength and the like is easily formed.

In addition, the lower molecular weight compound in the organic semiconductor composition that composes the organic film is preferentially unevenly distributed on the surface of the thin film. Here, the expression "the lower molecular weight compound being unevenly distributed on the surface of the thin film" indicates a state in which the content of the lower molecular weight compound in the vicinity of the surface of the organic film is higher than the content of the lower molecular weight compound farther inside the organic film. The content of the lower molecular weight compound in each portion of the organic film can be measured by, for example, an energy-filtered transmission electron microscope (EF-TEM). As a result of the lower molecular weight compound being unevenly distributed on the surface in this manner, the organic film is able to adequately demonstrate carrier transportability possessed by the lower molecular weight compound. The content of the lower molecular weight compound is preferably highest on the surface of the organic film and gradually decreases moving towards the inside. In addition, from the viewpoint of obtaining superior functional strength and carrier transportability of the organic film, in this case the content of the lower molecular weight compound preferably does not change suddenly. In particular, the content of the lower molecular weight compound on the surface of the organic film is preferably greater than the content throughout the organic film.

The organic semiconductor composition may further contain a higher molecular weight compound that does not have carrier transportability in addition to the carrier transporting higher molecular weight compound and the lower molecular weight compound in order to enhance mechanical properties of the organic film. An example of a higher molecular weight compound not having carrier transportability is a non-conjugated higher molecular weight compound, and that which does not excessively inhibit carrier transportability in the case of being in the form of an organic film is preferable. In addition, that for which absorption of visible light is not strong is preferable. Examples of such non-conjugated higher molecular weight compounds include polystyrenes (such as polystyrene, isotactic polystyrene or poly($\alpha$-methylstyrene)), polyethylenes (such as HD polyethylene), polypropylene, polyisoprene, polybutadiene, poly(4-methyl-1-pentene), poly(tetrafluoroethylene), polycarbonate, polyacrylate, polymethyl acrylate, polymethyl methacrylate and polyvinyl chloride. In addition, other examples include copolymers having repeating units comprising these non-conjugated higher molecular weight compounds (including random copolymers and block copolymers).

In addition, the organic semiconductor composition that composes the organic film may also contain other materials for demonstrating various functions. Examples of such materials include sensitizers that intensify a function that allows absorbed light to generate an electric charge, stabilizers that improve stability of the composition or organic film, and UV absorbers for absorbing UV light.

The organic film having the composition described above can be formed by a method in which, for example, a coating solution composed of a liquid organic semiconductor composition is prepared and the coating solution is used to deposit a film.

The organic semiconductor composition may be used as is for the coating solution, or a liquid organic semiconductor composition containing a solvent (solution or varnish) may be used. The former coating solution consisting only of the organic semiconductor composition can be used in the case the viscosity of the organic semiconductor composition per se is adequately low.

In a liquid organic semiconductor composition containing a solvent, the solvent may be that which is able to satisfactorily dissolve or disperse components contained in the organic semiconductor composition. Examples of solvents that can be suitably selected and applied include unsaturated hydrocarbon-based solvents such as toluene, xylene, mesitylene, tetralin, decalin, bicyclohexyl, n-butylbenzene, sec-butylbenzene or tert-butylbenzene, halogenated saturated hydrocarbon-based solvents such as carbon tetrachloride, chloroform, dichloromethane, dichloroethane, chlorobutane, bromobutane, chloropentane, bromopentane, chlorohexane, bromohexane, chlorocyclohexane or bromocyclohexane, halogenated unsaturated hydrocarbon-based solvents such as chlorobenzene, dichlorobenzene or trichlorobenzene, and ether-based solvents such as tetrahydrofuran or tetrahydropyran. Although varying according to the composition, components contained in the organic semiconductor composition can be dissolved in these solvents at 0.05% by weight or more. From the viewpoint of satisfactorily carrying out thin film formation, the content of components other than the solvent in the organic semiconductor composition is preferably about 0.1 to 5% by weight. In the case the solubility of the organic semiconductor composition is inadequate, heating may be carried out as subsequently described.

In forming the organic film, a thin film composed of the organic semiconductor composition is formed by coating such a coating solution onto a substrate. At this time, in the case the coating solution contains a solvent, the solvent is preferably removed either simultaneous to or after coating.

Examples of methods for coating the coating solution include spin coating, casting, microgravure coating, gravure coating, bar coating, roll coating, wire bar coating, dip coating, spray coating, screen printing, flexo printing, offset printing, ink jet printing, dispenser printing, nozzle coating and capillary coating. In particular, spin coating, flexo printing, ink jet printing, dispenser printing, nozzle coating and capillary coating are preferable.

Furthermore, this coating may be carried out in a heated state. As a result, a highly concentrated coating solution can be coated, which in addition to allowing a more uniform thin film to be formed, makes it possible to select a material for which coating was difficult at room temperature. Coating in a heated state can be carried out by, for example, using a preheated coating solution or coating while heating the substrate.

Although the coating solution is preferably made to have a viscosity that is optimum for the coating methods described above, in the case of using only a lower molecular weight compound, for example, since there are limitations on the type and amount of solvent able to dissolve it, it is extremely difficult to adjust the viscosity to a viscosity suitable for coating.

In contrast, since the organic semiconductor composition in the present embodiment contains a combination of a carrier transporting higher molecular weight compound and a lower molecular weight compound, the viscosity of the coating solution can be adjusted over a wide range by adjusting the composition of their combination. In this manner, since viscosity of the coating solution can be adjusted regardless of the type or amount of solvent, the degree of freedom in selecting a solvent increases. In addition, since the coating solution can be adjusted with a high degree of freedom in this manner, an organic film can be satisfactorily formed even for a substrate having high surface free energy for which coating is normally difficult due to the contact angle with respect to the coating solution being excessively large (for example, 90° or more). Thus, according to the organic semiconductor composition of the present invention, an organic film that is nearly uniform and has high carrier transportability can be satisfactorily formed in the production of an organic film element.

The step for forming the organic film as described above can be carried out as one step in the production of an organic film element. In this case, for example, the substrate on which the organic film is formed is a structure generated in the production process of the organic film element. A step for imparting a prescribed orientation to the organic film formed in this manner may be further carried out from the viewpoint of further enhancing the carrier transportability of the organic film in the organic film element. Since molecules in the organic semiconductor composition that composes the oriented organic film are arranged in a single direction therein, carrier transportability tends to be further enhanced.

A method known to be a crystal orientation method, for example, can be used for the orientation method. In particular, methods such as a lapping method, a photoorientation method, a shearing method (shear stress printing method) or lift coating are convenient and easy to use as orientation methods, while the lapping method and shearing method are particularly preferable.

[Organic Film Element]

Since the organic film as described above is able to demonstrate high carrier (electron or hole) transportability, electrons or holes injected from electrodes provided on these organic films or an electric charge generated by absorption of light can be transported, thereby enabling the organic film to be applied to various organic film elements such as an organic film transistor, organic solar cell or optical sensor by taking advantage of these properties. The following provides individual explanations of these organic film elements.

(Organic Film Transistor)

An example of an organic film transistor that uses the previously described organic film has a composition provided with a source electrode and drain electrode, an organic semiconductor layer (active layer) serving as a current path between these electrodes, and a gate electrode that controls current flow through this current path, and the organic semiconductor layer is composed by the above-mentioned organic film. Examples of such organic film transistors include a field effect transistor and static induction transistor.

A field effect organic film transistor is preferably provided with a source electrode and drain electrode, an organic semiconductor layer (active layer) serving as a current path there between, a gate electrode that controls current flow through this current path, and an insulating layer arranged between the organic semiconductor layer and the gate electrode. In particular, the source electrode and the drain electrode are preferably provided in contact with the organic semiconductor layer (active layer), and the gate electrode is preferably provided interposing the insulating layer in contact with the organic semiconductor layer. In this field effect organic film transistor, the organic semiconductor layer is composed by an organic film composed of the organic semiconductor composition of the present invention.

A static induction organic film transistor has a gate electrode and drain electrode, an organic semiconductor layer (active layer) serving as a current path there between, and a gate electrode that controls current flow through the current path, and this gate electrode is preferably provided in the organic semiconductor layer. In particular, the source electrode, the drain electrode and the gate electrode provided in the organic semiconductor layer are preferably provided in contact with the organic semiconductor layer. Here, the structure of the gate electrode is a structure in which a current path is formed that flows from the source electrode to the drain electrode, and the amount of current that flows through the current path can be controlled with the voltage applied to the gate electrode, and an example of such a structure is a comb electrode. In this static induction organic film transistor as well, the organic semiconductor layer is composed by an organic film composed of the organic semiconductor composition of the present invention.

FIG. 1 is a schematic cross-sectional view of an organic film transistor (field effect organic film transistor) relating to a first embodiment. An organic film transistor 100 shown in FIG. 1 is provided with a substrate 1, a source electrode 5 and a drain electrode 6 formed at a prescribed interval on the substrate 1, an organic semiconductor layer 2 formed on the substrate 1 to as to cover the source electrode 5 and the drain electrode 6, an insulating layer 3 formed on the organic semiconductor layer 2, and a gate electrode 4 formed on the insulating layer 3 so as to cover the region of the insulating layer 3 between the source electrode 5 and the drain electrode 6.

Figure 2:
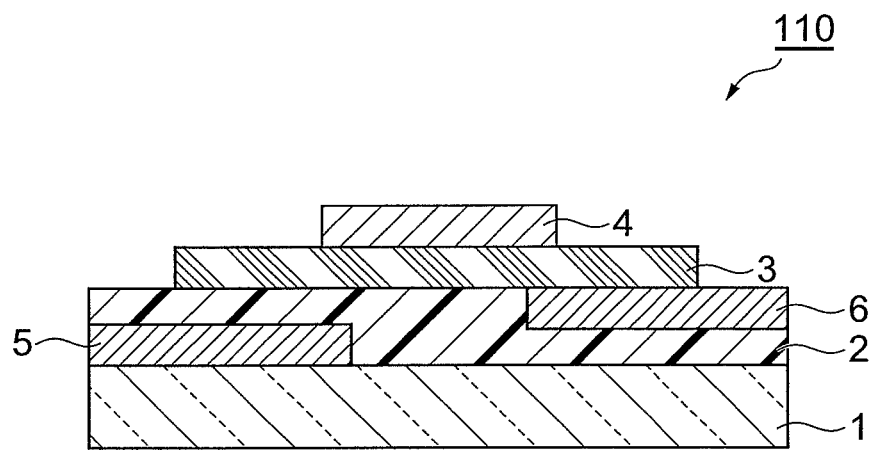
FIG. 2 is a schematic cross-sectional view of an organic film transistor relating to a second embodiment.

FIG. 2 is a schematic cross-sectional view of an organic film transistor (field effect organic film transistor) relating to a second embodiment. An organic film transistor 110 shown in FIG. 2 is provided with the substrate 1, the source electrode 5 formed on the substrate 1, the organic semiconductor layer 2 formed on the substrate 1 so as to cover the source electrode 5, the drain electrode 6 formed on the organic semiconductor layer 2 at a prescribed interval from the source electrode 5, the insulating layer 3 formed on the organic semiconductor layer 2 and the drain electrode 6, and the gate electrode 4 formed on the insulating layer 3 so as to cover the region of the insulating layer 3 between the source electrode 5 and the drain electrode 6.

Figure 3:
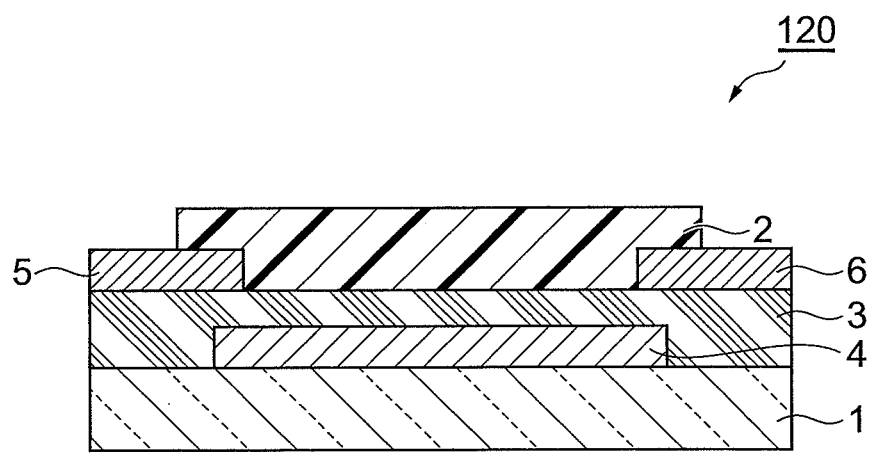
FIG. 3 is a schematic cross-sectional view of an organic film transistor relating to a third embodiment.

FIG. 3 is a schematic cross-sectional view of an organic film transistor (field effect organic film transistor) relating to a third embodiment. An organic film transistor 120 shown in FIG. 3 is provided with the substrate 1, the gate electrode 4 formed on the substrate 1, the insulating layer 3 formed on the substrate 1 so as to cover the gate electrode 4, the source electrode 5 and the drain electrode 6 formed at a prescribed interval on the insulating layer 3 so as to cover a portion of the region of the insulating layer 3 where the gate electrode 4 is formed below, and the organic semiconductor layer 2 formed on the insulating layer 3 so as to cover a portion of the source electrode 5 and the drain electrode 6.

Figure 4:
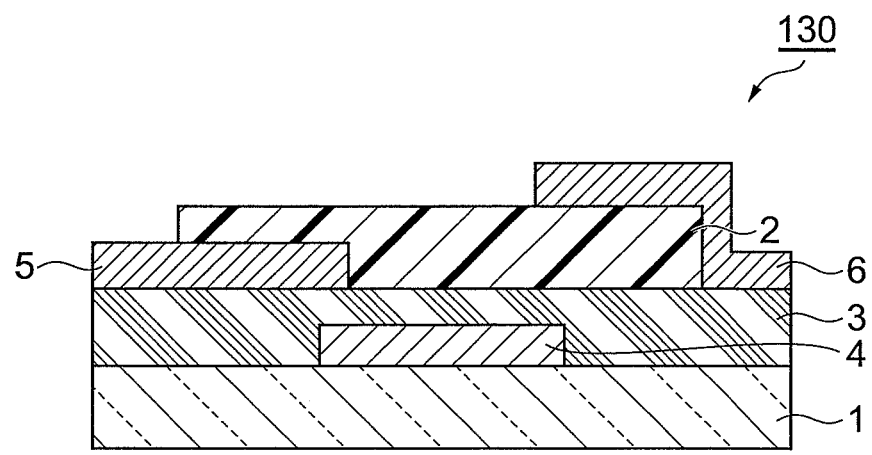
FIG. 4 is a schematic cross-sectional view of an organic film transistor relating to a fourth embodiment.

FIG. 4 is a schematic cross-sectional view of an organic film transistor (field effect organic film transistor) relating to a fourth embodiment. An organic film transistor 130 shown in FIG. 4 is provided with the substrate 1, the gate electrode 4 formed on the substrate 1, the insulating layer 3 formed on the substrate 1 so as to cover the gate electrode 4, the source electrode 5 formed on the insulating layer 3 so as to cover a portion of the region of the insulating layer 3 where the gate electrode 4 is formed below, the organic semiconductor layer 2 formed on the insulating layer 3 so as to cover a portion of the source electrode 5, and the drain electrode 6 formed on the insulating layer 3 at a prescribed interval from the source electrode 5 so as to cover a portion of the region of the organic semiconductor layer 2 where the gate electrode 4 is formed below.

Figure 5:
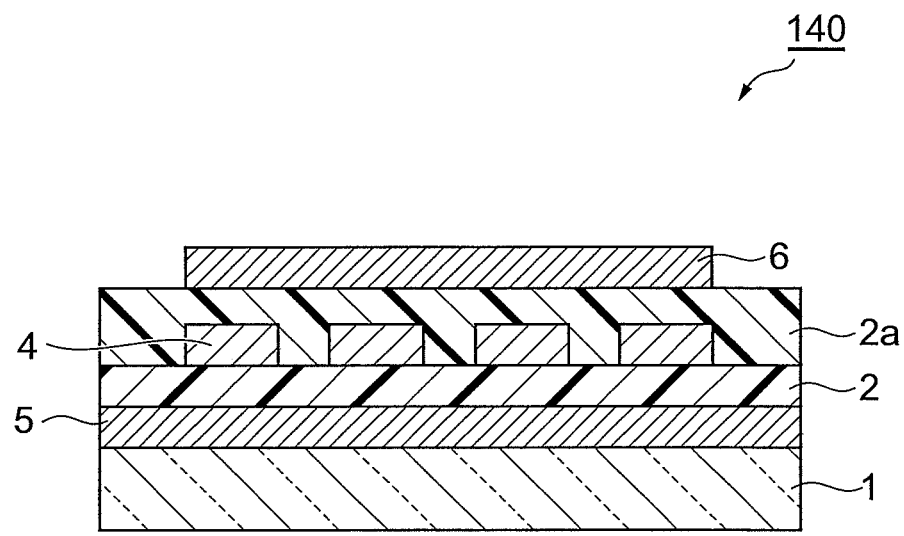
FIG. 5 is a schematic cross-sectional view of an organic film transistor relating to a fifth embodiment.

FIG. 5 is a schematic cross-sectional view of an organic film transistor (static induction organic film transistor) relating to a fifth embodiment. An organic film transistor 140 shown in FIG. 5 is provided with the substrate 1, the source electrode 5 formed on the substrate 1, the organic semiconductor layer 2 formed on the source electrode 5, a plurality of the gate electrodes 4 formed at prescribed intervals on the organic semiconductor layer 2, an organic semiconductor layer 2a (the material that composes the organic semiconductor layer 2a may be the same or different as that which composes the organic semiconductor layer 2) formed on the organic semiconductor layer 2 so as to cover all of the gate electrodes 4, and the drain electrode 6 formed on the organic semiconductor layer 2a.

Figure 6:
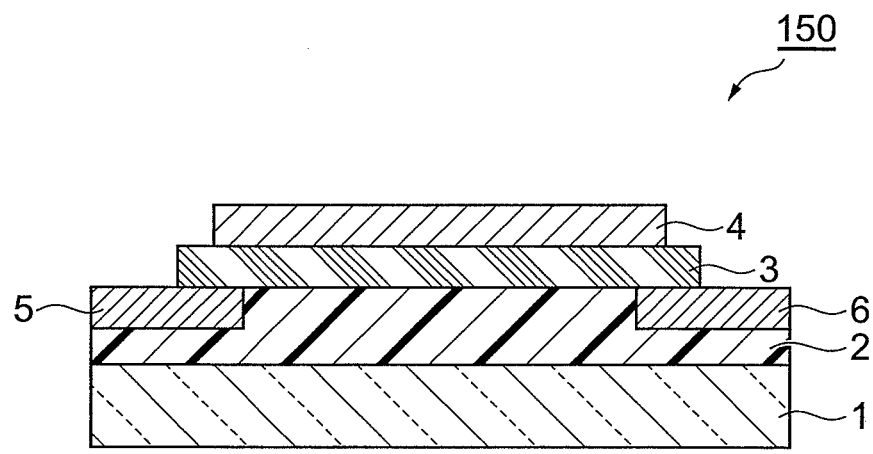
FIG. 6 is a schematic cross-sectional view of an organic film transistor relating to a sixth embodiment.

FIG. 6 is a schematic cross-sectional view of an organic film transistor (field effect organic film transistor) relating to a sixth embodiment. An organic film transistor 150 shown in FIG. 6 is provided with the substrate 1, the organic semiconductor layer 2 formed on the substrate 1, the source electrode 5 and the drain electrode 6 formed at a prescribed interval on the organic semiconductor layer 2, the insulating layer 3 formed on the organic semiconductor layer 2 so as to cover a portion of the source electrode 5 and the drain electrode 6, and the gate electrode 4 formed on the insulating layer 3 so as to respectively cover a portion of the region of the insulating layer 3 where the source electrode 5 is formed below and a portion of the insulating layer 3 where the drain electrode 6 is formed below.

Figure 7:
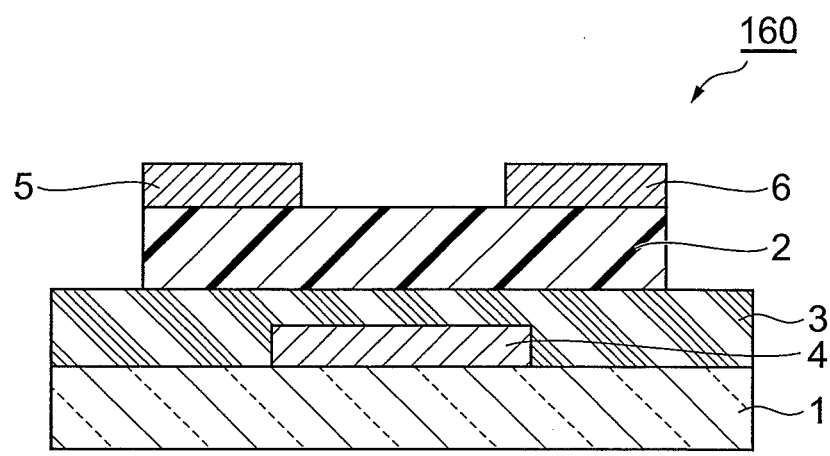
FIG. 7 is a schematic cross-sectional view of an organic film transistor relating to a seventh embodiment.

FIG. 7 is a schematic cross-sectional view of an organic film transistor (field effect organic film transistor) relating to a seventh embodiment. An organic film transistor 160 shown in FIG. 7 is provided with the substrate 1, the gate electrode 4 formed on the substrate 1, the insulating layer 3 formed on the substrate 1 so as to cover the gate electrode 4, the organic semiconductor layer 2 formed so as to cover the region of the insulating layer 3 where the gate electrode 4 is formed below, the source electrode 5 formed on the organic semiconductor layer 2 so as to cover a portion of the region of the organic semiconductor layer 2 where the gate electrode 4 is formed below, and the drain electrode 6 formed on the organic semiconductor layer 2 at a prescribed interval from the source electrode 5 so as to cover a portion of the region of the organic semiconductor layer 2 where the gate electrode 4 is formed below.

In the organic film transistors relating to the first to seventh embodiments described above, the organic semiconductor layer 2 and/or the organic semiconductor layer 2a are composed by an organic film composed of the organic semiconductor composition of the present invention, and serve as a current path (channel) between the source electrode 5 and the drain electrode 6. In addition, the gate electrode 4 controls the amount of current that flows through the current path (channel) in the organic semiconductor layer 2 and/or the organic semiconductor layer 2a by applying a voltage.

This type of field effect organic film transistor can be produced by a known method such as the method described in Japanese Patent Application Laid-Open No. H5-110069. In addition, a static induction organic film transistor can be produced by a known method such as the method described in Japanese Patent Application Laid-Open No. 2004-006476.

A glass substrate, flexible film substrate or plastic substrate can be used for the substrate 1 provided it does not impair properties of the organic film transistor.

When forming the organic semiconductor layer 2, compounds that are soluble in organic solvent are preferably used in terms of production for the carrier transporting higher molecular weight compound and the lower molecular weight compound. Thus, an organic film that serves as the organic semiconductor layer 2 can be formed using the production method of an organic film described in the above-mentioned embodiments.

The insulating layer 3 in contact with the organic semiconductor layer 2 is a material having high electrical insulating properties, and a known material can be used. Examples of such materials include $SiO_x$, $SiN_x$, $Ta_2O_5$, polyimide, polyvinyl alcohol, polyvinyl phenol, organic glass and photoresist. A material having high dielectric constant is preferable from the viewpoint of lowering voltage.

In the case of forming the organic semiconductor layer 2 on the insulating layer 3, the organic semiconductor layer 2 can be formed after modifying the surface of the insulating layer 3 by treating the surface of the insulating layer 3 with a surface treatment agent such as a silane coupling agent in order to improve the interface characteristics between the insulating layer 3 and the organic semiconductor layer 2.

In the case of a field effect organic film transistor, carriers such as electrons or holes typically pass through the insulating layer and organic semiconductor layer in proximity to the interface thereof. Thus, the state of this interface has a considerable effect on transistor mobility. Therefore, a method for improving characteristics by modifying the state of the interface is known in which the interface is controlled with a silane coupling agent (for example, Surface Science, Vol. 28, No. 5, pp. 242-248, 2007).

Examples of silane coupling agents include alkylchlorosilanes (such as octyltrichlorosilane (OTS), octadecyltrichlorosilane (ODTS) or phenylethyltrichlorosilane), alkylalkoxysilanes, fluorinated alkylchlorosilanes, fluorinated alkylalkoxysilanes, and silylamine compounds such as hexamethyldisilazane (HMDS). In addition, the surface of the insulating layer can also be treated with ozone UV or $O_2$ plasma prior to treating with a surface treatment agent.

As a result of such treatment, the surface energy such as that of a silicon oxide film used as an insulating film can be controlled. In addition, the orientation of the organic semiconductor composition that composes the organic semiconductor layer on the insulating film can be improved by surface treatment, thereby allowing the obtaining of high carrier transportability (mobility). A conventional example of such treatment employs an orientation for pentacene deposited by vapor deposition in which herringbone structures are stacked on a surface-treated substrate between nearly vertical molecules.

However, in conventional organic semiconductor compounds in which an organic film is formed by coating, water repellency may increase due to treatment with silane coupling agent, thereby preventing the production of a uniform thin film. This is thought to be due to an increase in surface energy causing an increase in the contact angle between the organic semiconductor compound and the coated surface resulting in poor wettability. Furthermore, although this trend is not always that large in the case of amorphous materials, this trend is particularly prominent in lower molecular weight compounds susceptible to crystallization.

Consequently, in the case of forming a thin film on an insulating layer subjected to surface treatment as described above, so-called coffee staining phenomenon, in which film thickness decreases from the outside towards the center of the formed film, becomes prominent, while in the case of forming a thin film by spin coating, it may be completely impossible to form a thin film due to scattering of the material.

In contrast, the organic semiconductor composition of the present invention used in the present embodiment is able to control wettability and viscosity of a coated solution as described in the section describing the above-mentioned organic film by combining a lower molecular weight compound and a higher molecular weight compound having carrier transportability. Consequently, a high-quality organic semiconductor layer can be easily formed even on an insulating layer surface that has undergone surface treatment with a silane coupling agent and the like. Characteristics such as mobility are greatly improved as a result of improving the quality of the thin film.

A material such as a metal such as gold, platinum, silver, copper, chromium, palladium, aluminum, indium, molybdenum, low-resistance polysilicon or low-resistance amorphous silicon, or tin oxide, indium oxide or indium-tin oxide (ITO), can be used for the gate electrode 4. One type of these materials can be used or two or more types can be used in combination. Furthermore, a silicon substrate doped to a high concentration can also be used for the gate electrode 4. A silicone substrate doped to a high concentration has both properties as a gate electrode and properties as a substrate. In the case of using the gate electrode 4 having such properties as a substrate, the substrate 1 may be omitted from an organic film transistor in which the substrate 1 and the gate electrode 4 are in contact. For example, in the organic film transistor of the previously described seventh embodiment, the organic film transistor has a structure shown in FIG. 12 in the case a constitution is employed in which the gate electrode 4 also serves as the substrate 1.

The source electrode 5 and the drain electrode 6 are preferably composed of low-resistance materials, and are particularly preferable composed of materials such as gold, platinum, silver, copper, chromium, palladium, aluminum, indium and molybdenum. One type of these materials may be used alone or two or more types may be used in combination.

Although the above has provided an explanation of several examples of preferred embodiments of organic film transistors, the organic film transistor is not limited to the above-mentioned embodiments. For example, a layer composed of a compound differing from an organic semiconductor compound may be interposed between the source electrode 5 and drain electrode 6 and the organic semiconductor layer 2. As a result, contact resistance between the source electrode 5 and drain electrode 6 and the organic semiconductor layer 2 is reduced, and the carrier mobility of the organic film transistor may be able to be further enhanced.

Examples of such layers include layers composed of a lower molecular weight compound having electron or hole transportability as previously described, alkaline metals, alkaline earth metals, rare earth metals or complexes of these metals and an organic compound, halogens such as iodine, bromine, chlorine or iodine chloride, sulfur oxide compounds such as sulfuric acid, sulfuric acid anhydride, sulfur dioxide or sulfate, nitrogen oxide compounds such as nitric acid, nitrogen dioxide or nitrate, halogenated compounds such as perchloric acid or hypochlorous acid, alkylthiol compounds and aromatic thiol compounds such as aromatic thiols or fluorinated alkyl aromatic thiols.

In addition, a protective film is preferable formed on the organic film transistor after having produced the organic film transistor as described above in order to protect the element. As a result, the organic film transistor can be isolated from the atmosphere and decreases in characteristics of the organic film transistor can be inhibited. In addition, in the case of forming a driving display device on the organic film transistor, effects of the formation process thereof on the organic film transistor can be reduced by the protective film.

An example of a method for forming a protective film consists of covering the organic film transistor with a UV-curable resin, thermosetting resin or inorganic SiONx film and the like. In order to effectively isolate the organic film transistor from the atmosphere, the process through formation of the protective film following production of the organic film transistor is preferably carried out without exposing the organic film transistor to the atmosphere (such as by carrying out in a dry nitrogen atmosphere or in a vacuum).

An organic field effect transistor, which is a type of organic film transistor composed in this manner, can be applied as a pixel-driven switching element and the like of an active matrix drive type of liquid crystal display or organic electroluminescence display. Since the organic field effect transistor of the above-mentioned embodiment is provided with an organic film having superior carrier transportability composed of the organic semiconductor composition of the present invention for the organic semiconductor layer, the field effect mobility thereof is high. Thus, this organic field effect transistor is useful in the production of a display having an adequate response speed.

(Solar Cell)

The following provides an explanation of applying the organic film of the present invention to a solar cell.

Figure 8:
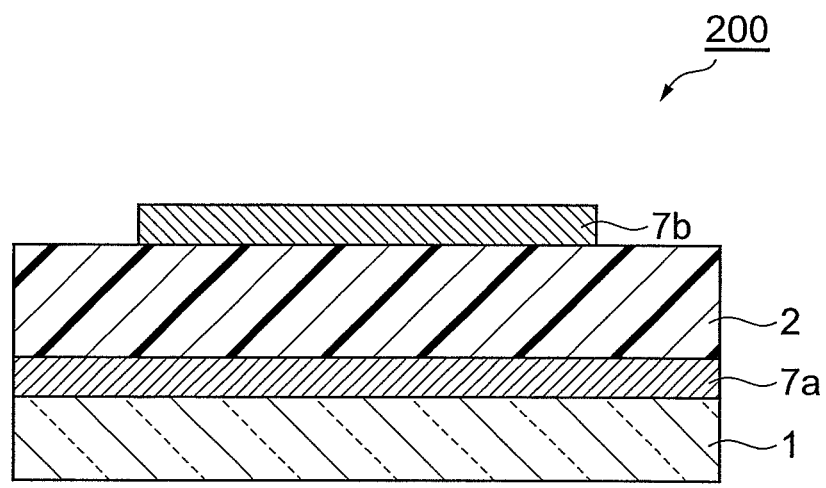
FIG. 8 is a schematic cross-sectional view of a solar cell relating to an embodiment.

FIG. 8 is a schematic cross-sectional view of a solar cell relating to a preferred embodiment. A solar cell 200 shown in FIG. 8 is provided with the substrate 1, a first electrode 7a formed on the substrate 1, an organic semiconductor layer 2 composed of an organic film formed on the first electrode 7a, and a second electrode 7b formed on the organic semiconductor layer 2. The organic film that composes the organic semiconductor layer 2 is composed by the organic semiconductor composition of the present invention.

In the solar cell relating to the present embodiment, a transparent or translucent electrode is used for one of the first electrode 7a and the second electrode 7b. A metal such as aluminum, gold, silver, copper, alkaline metal or alkaline earth metal, or a translucent film or transparent conductive film thereof can be used for the electrode material. The materials are preferably selected so that there is a large difference between the work function of each electrode in order to obtain a high open circuit voltage. A charge generation agent or intensifier and the like can be added to the organic semiconductor layer 2 (organic film) to enhance photosensitivity. A silicon substrate, glass substrate or plastic substrate and the like can be used for the substrate 1.

A solar cell having the composition described above can efficiently generate electricity since the organic semiconductor layer 2 that uses an organic film prepared by using the organic semiconductor composition of the present invention is able to demonstrate high carrier transportability.

(Optical Sensor)

The following provides an explanation of application of the organic film of the present invention to an optical sensor.

Figure 9:
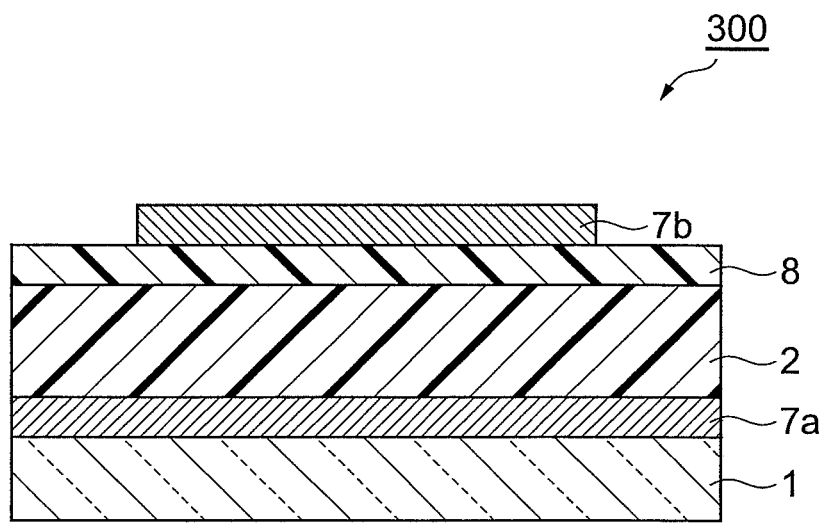
FIG. 9 is a schematic cross-sectional view of an optical sensor relating to a first embodiment.

FIG. 9 is a schematic cross-sectional view of an optical sensor relating to the first embodiment. An optical sensor 300 shown in FIG. 9 is provided with the substrate 1, the first electrode 7a formed on the substrate 1, the organic semiconductor layer 2 composed of an organic film formed on the first electrode 7a, a charge generation layer 8 formed on the organic semiconductor layer 2, and a second electrode 7b formed on the charge generation layer 8. The organic film that composes the organic semiconductor layer 2 is composed by the organic semiconductor composition of the present invention.

Figure 10:
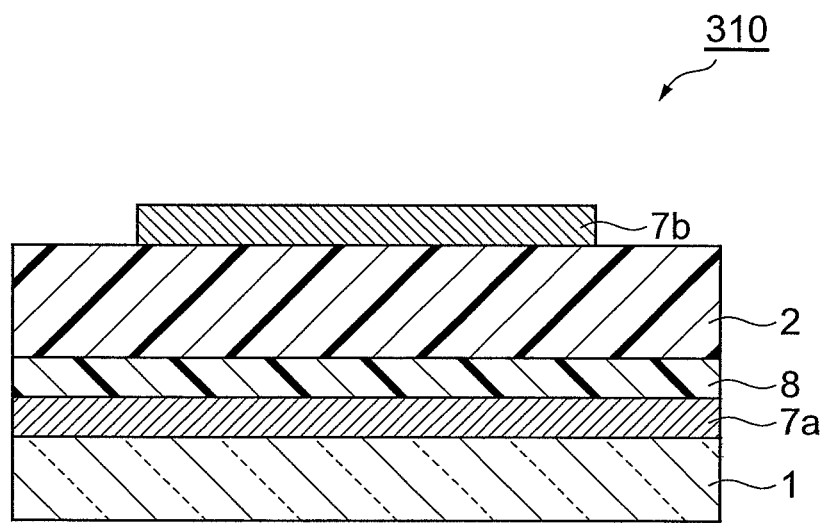
FIG. 10 is a schematic cross-sectional view of an optical sensor relating to a second embodiment.

FIG. 10 is a schematic cross-sectional view of an optical sensor relating to the second embodiment. An optical sensor 310 shown in FIG. 10 is provided with the substrate 1, the first electrode 7a formed on the substrate 1, the charge generation layer 8 formed on the first electrode 7a, the organic semiconductor layer 2 composed of an organic film formed on the charge generation layer 8, and the second electrode 7b formed on the organic semiconductor layer 2. The organic film that composes the organic semiconductor layer 2 is composed by the organic semiconductor composition of the present invention.

Figure 11:
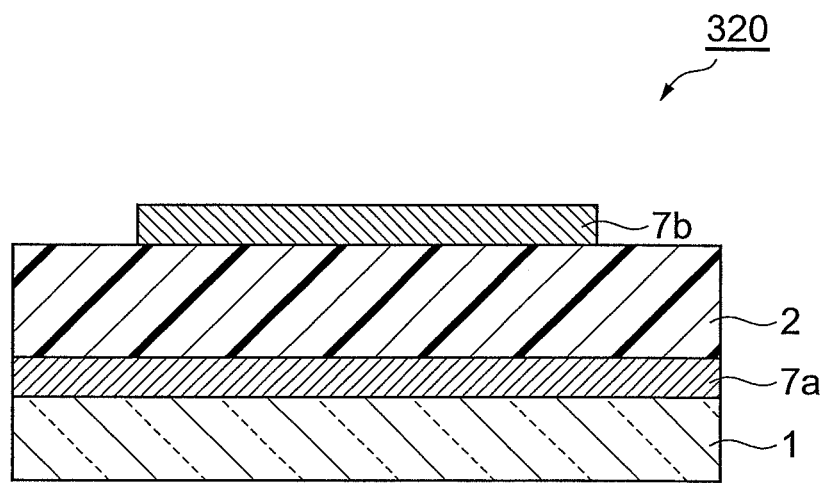
FIG. 11 is a schematic cross-sectional view of an optical sensor relating to a third embodiment.

FIG. 11 is a schematic cross-sectional view of an optical sensor relating to the third embodiment. An optical sensor 320 shown in FIG. 11 is provided with the substrate 1, the first electrode 7a formed on the substrate 1, the organic semiconductor layer 2 composed of an organic film formed on the first electrode 7a, and the second electrode 7b formed on the organic semiconductor layer 2. The organic film that composes the organic semiconductor layer 2 is composed by the organic semiconductor composition of the present invention.

In the optical sensors relating to the first to third embodiments described above, a transparent or translucent electrode is used for one of the first electrode 7a and the second electrode 7b. The charge generation layer 8 is a layer that generates an electrical charge by absorbing light. A metal such as aluminum, gold, silver, copper, alkaline metal or alkaline earth metal, or a translucent film or transparent conductive film thereof can be used for the electrode material. A charge generation agent or intensifier and the like can be added to the organic semiconductor layer 2 (organic film) to enhance photosensitivity. In addition, a silicon substrate, glass substrate or plastic substrate and the like can be used for the substrate 1.

The optical sensors having the compositions described above allow the obtaining of high sensitivity since the organic semiconductor layer 2 that uses an organic film prepared by using the organic semiconductor composition of the present invention is able to demonstrate high carrier transportability.

EXAMPLE

Although the following provides a more detailed explanation of the present invention through examples thereof, the present invention is not limited to these examples.

[Experiment 1]

First, compounds represented by the following formulas (13), (14), (15), (16) and (17) were prepared for use as carrier transporting higher molecular weight compounds, while compounds represented by the following formulas (18), (19) and (20) were prepared for use as lower molecular weight compounds. Furthermore, n1, n2, n3, n4 and n5 in compounds (13) to (17) are numbers indicating the number of repetitions of structures shown in parentheses, and are corresponding numbers at which the weight average molecular weights of the compounds as polystyrene become 69,000 (compound (13)), 145,000 (compound (14)), 351,000 (compound (15)), 42,000 (compound (16)) and 164,000 (compound (17)), respectively. In addition, n1, n2, n3, n4 and n5 are corresponding numbers at which the number average molecular weights of the corresponding compounds as polystyrene become 41,000 (compound (13)), 73,000 (compound (14)), 85,000 (compound (15)), 22,000 (compound (16)) and 23,000 (compound (17)), respectively.

[C7]

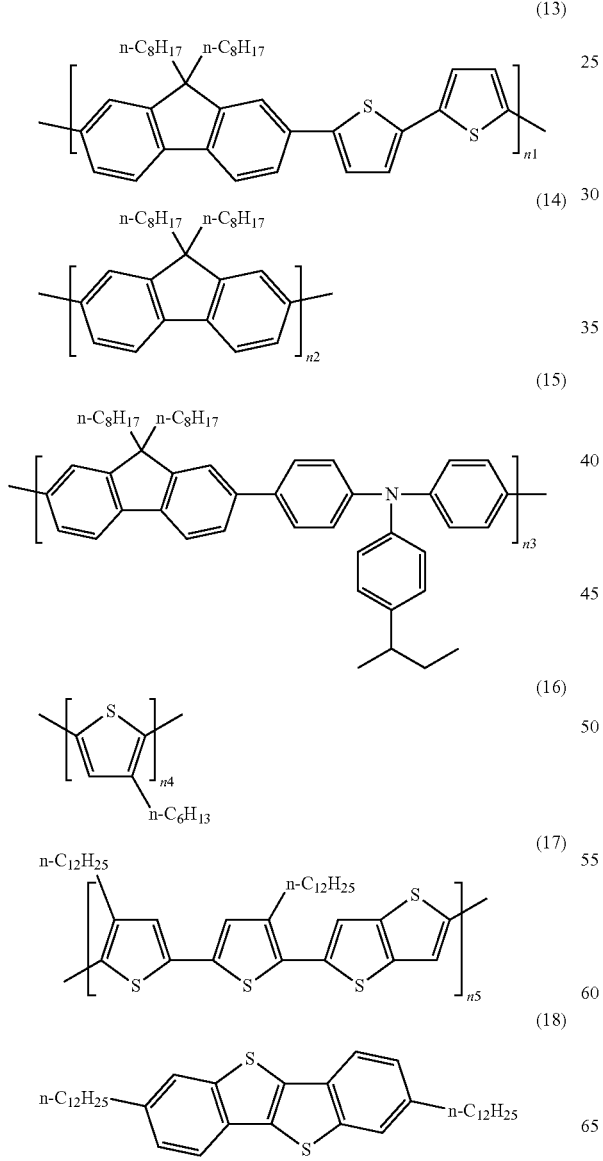

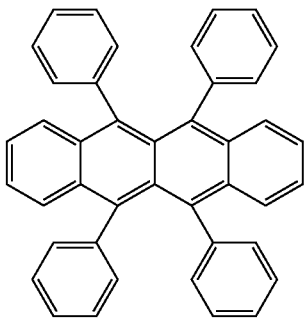

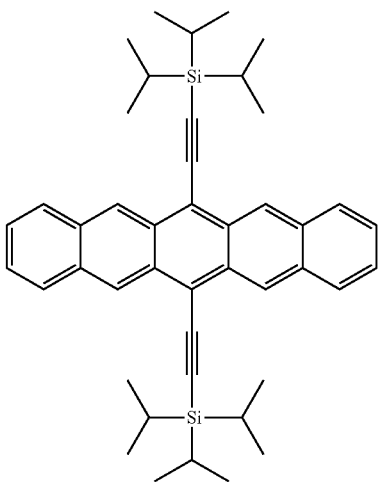

Next, the solubility parameters (SP) of the these carrier transporting higher molecular weight compounds and lower molecular weight compounds were determined according to the previously described method, and the differences in SP (ΔSP) were calculated by combining the carrier transporting higher molecular weight compounds and lower molecular weight compounds. The results that were obtained are summarized in Table 5. In Table 5, the value in parentheses shown with the compound name indicates the value of SP possessed by each compound, while the values shown at those locations in the table where the rows of carrier transporting higher molecular weight compounds and the columns of lower molecular weight compounds intersect indicate the relative values of the difference in SP values (ΔSP) between the compounds.

TABLE 5

| | | Carrier Transporting Higher molecular weight compounds | | | | |
|---|---|---|---|---|---|---|
| | | Compound (13) (17.02) | Compound (14) (15.99) | Compound (15) (17.10) | Compound (16) (16.80) | Compound (17) (17.27) |
| Lower molecular weight compounds | Compound (18) (18.02) | 1.00 | 2.03 | 0.92 | 1.22 | 0.75 |
| | Compound (19) (18.96) | 1.94 | 2.97 | 1.86 | 2.16 | 1.69 |
| | Compound (20) (17.42) | 0.40 | 1.43 | 0.32 | 0.62 | 0.15 |

As an example, an organic semiconductor composition (ΔSP=1.00) was prepared by mixing compound (13), which is a carrier transporting higher molecular weight compound, and compound (18), which is a lower molecular weight compound, at a ratio of 50:50 (weight ratio). First, after dissolving this in a chloroform solvent, a thin film was formed by spin coating and the surface of the thin film was observed with a scanning electron microscope (SEM). As a result, compound (13) and compound (18) were confirmed to have formed a sea-island structure in the thin film.

As a result of measuring this organic semiconductor composition by DSC, although the peak that appears during melting of compound (13) disappeared, a transition peak of compound (18) shifted from a crystal phase to a liquid crystal phase and enthalpy decreased. Thus, compound (13) and compound (18) were confirmed to be partially compatible.

In addition, an organic semiconductor composition (ΔSP=0.92) was prepared by mixing compound (15), which is a carrier transporting higher molecular weight compound, and compound (18), which is a lower molecular weight compound, at a ratio of 30:70 (weight ratio). First, after dissolving this in a toluene solvent, a thin film was formed on an insulating film by spin coating and the thin film was observed with an energy-filtered transmission electron microscope (EF-TEM). As a result, sulfur contained only in compound (18) was confirmed to be unevenly distributed at the interface between the thin film and the insulating film and on the surface of the thin film on the opposite side from the insulating film. This means that the lower molecular weight compound in the form of compound (18) is unevenly distributed on the surface of the thin film. However, since the concentration gradient of sulfur was gradual from the surface to the inside of the thin film, compound (15) and compound (18) were confirmed to not be separated. Furthermore, in the present description, the "surface" of a thin film refers to an interface with any component in the thin film, such as a gas, liquid or solid. Examples of such interfaces include the interface between the thin film and insulating film, the interface between the thin film and the atmosphere, and the interface between the thin film and a protective film.

As a comparative example, an organic semiconductor composition (ΔSP=2.03) was prepared by mixing compound (14), which is a carrier transporting higher molecular weight compound, and compound (18), which is a lower molecular weight compound, at a ratio of 1:1. As a result of forming a thin film and observing in the same manner, it was determined that a sea-island structure was not formed, but rather compound (14) and compound (18) were determined to have separated based on an EDX (energy-dispersive X-ray) analysis of the cross-section thereof.

Moreover, as another comparative example, as a result of preparing an organic semiconductor composition (ΔSP=0.40) by using compound (13), which is a carrier transporting higher molecular weight compound, and compound (20), which is a lower molecular weight compound and evaluating the resulting thin film, a sea-island structure was not formed and separation was unable to be confirmed.

Figure 12:
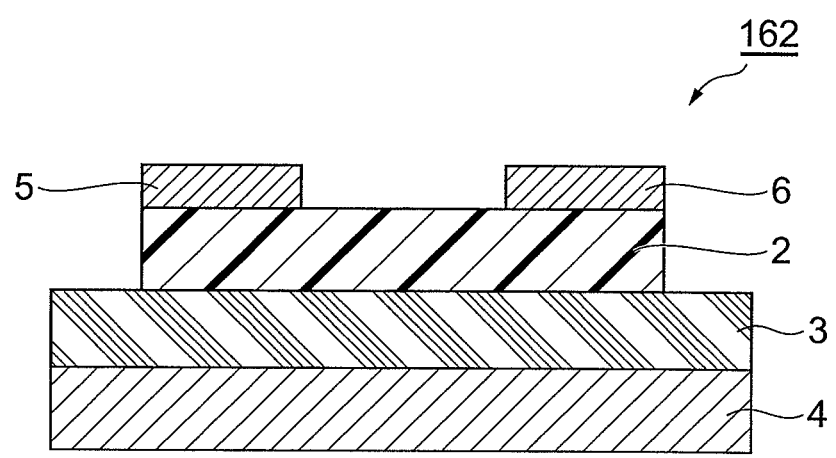
FIG. 12 is a schematic cross-sectional view of an organic film transistor relating to a seventh embodiment in the case of employing a structure in which a gate electrode also serves as a substrate.

[Experiment 2]
(Production of Organic Film Transistor)
An organic film transistor having the structure shown in FIG. 12 was produced by using an organic semiconductor composition (ΔSP=1.00) containing the above-mentioned compound (13) (SP=17.02) as a carrier transporting higher molecular weight compound and the above-mentioned compound (18) (SP=18.02) as a lower molecular weight compound.

Namely, the surface of an n-type silicon substrate doped to a high concentration for use as a gate electrode was subjected to thermal oxidation to form a 200 nm silicon oxide film. Following ultrasonic cleaning of the substrate with acetone for 10 minutes, the substrate was irradiated with ozone UV for 30 minutes. Subsequently, the substrate was immersed for 15 hours in a glove box using a diluted octane solution of octadecyltrichlorosilane (ODTS) to carry out silane treatment on the substrate surface.

In addition, compound (13) (copolymer of 9,9-dioctylfluorene and bithiophene: weight average molecular weight as polystyrene=69,000) and compound (18) (didodecylbenzothienobenzothiophene) were dissolved in a chloroform solvent, a solution (organic semiconductor composition) was prepared in which the total concentration of these compounds was 0.5% by weight, and this was filtered with a membrane filter to prepare a coating solution.

Subsequently, the resulting coating solution was coated onto the above-mentioned surface-treated substrate by spin coating to form a thin film (organic film) containing compound (13) and compound (18) and having a thickness of about 60 nm. A source electrode and drain electrode having a channel length of 20 μm and channel width of 2 mm (having a laminated structure of fullerene and gold from the side of the organic film) were produced on the organic film by vacuum deposition using a metal mask.

Furthermore, in Experiment 2, various types of coating solutions were prepared in which the ratio of compound (13) and compound (18) was changed as shown in the following Table 6, and these were respectively used to produce the five types of organic film transistors of samples 1 to 5.

(Evaluation of Characteristics)
Characteristics of each of the organic film transistors of sample numbers 1 to 5 obtained in the manner described above were measured under conditions of changing the gate voltage Vg from 0 to −60 V and changing the source-drain voltage Vsd from 0 to −60 V. The field effect mobility (mobility) according to the organic film transistors of Experiment 2 as calculated from the transfer characteristics obtained from these measurements is shown in the table.

TABLE 6

| Sample No. | Blending ratio of organic semiconductor composition (weight ratio) | | Mobility (cm$^2$/Vs) |
|---|---|---|---|
| | Compound (13) | Compound (18) | |
| 1 | 90 | 10 | 0.027 |
| 2 | 70 | 30 | 0.015 |
| 3 | 50 | 50 | 2.1 |
| 4 | 30 | 70 | 1.8 |
| 5 | 20 | 80 | 0.13 |

[Experiment 3]
(Production of Organic Film Transistors)
Organic film transistors having the structure shown in FIG. 12 were produced in the same manner as Experiment 2 with the exception of preparing organic semiconductor compositions by using the above-mentioned compounds (13) to (17) as carrier transporting higher molecular weight compounds and the above-mentioned compounds (18) to (20) as lower molecular weight compounds in the each of the combinations shown in Table 7 so that the blending ratio (weight ratio) of the former to the latter was 50:50.

(Evaluation of Characteristics)

Characteristics of the organic film transistors of each sample were measured under conditions of changing the gate voltage Vg from 0 to −60 V and changing the source-drain voltage Vsd from 0 to −60 V, followed by determination of mobility from the resulting transfer characteristics.

At this time, each mobility obtained in the case of using only the carrier transporting higher molecular weight compound or lower molecular weight compound contained in the organic semiconductor composition used in each sample was also similarly measured. The percentage of the increase (a rate of increase) or decrease in mobility obtained using the organic semiconductor composition relative to mobility obtained by using only the carrier transporting higher molecular weight compound or lower molecular weight compound (reference mobility) was then determined for each sample. Furthermore, at this time, the higher mobility value among the mobility values of the carrier transporting higher molecular weight compound and the lower molecular weight compound was used for the reference mobility. The percent increase Z (%) indicates the value determined in accordance with the equation below.

Percent increase $Z = (B/O - 1) \times 100 (\%)$

B: Mobility obtained using organic semiconductor composition

O: Reference mobility

The mobility and percent increase values obtained with each of the samples of organic film transistors are shown in Table 7 along with SP, mobility, and organic semiconductor composition ΔSP values for the carrier transporting higher molecular weight compound or lower molecular weight compound only corresponding to those used in each of the samples. In addition, FIG. 13 shows a graph in which the mobility percent increase values obtained with each sample are plotted versus the ΔSP values of the organic semiconductor composition in each sample.

Figure 13:
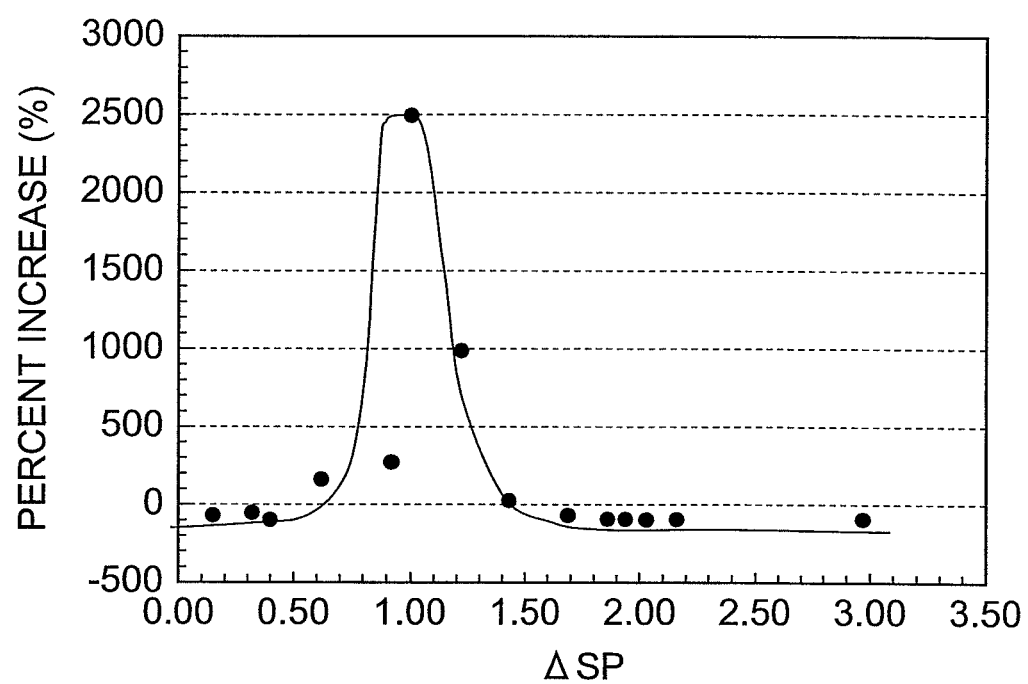
FIG. 13 is a graph in which values of the rate of increase of mobility is plotted versus values of ΔSP of an organic semiconductor composition.

According to Table 7 and FIG. 13, organic film transistors obtained using an organic semiconductor composition that contains a carrier transporting higher molecular weight compound and lower molecular compound in a combination at which ΔSP is within the range of the invention of the present application were confirmed to have a considerably larger percent increase in comparison with the case of combinations at which ΔSP is outside the range of the invention of the present application, and were confirmed to have improved carrier transportability in comparison with the case of using the carrier transporting higher molecular weight compound or lower molecular weight compound alone.

[Experiment 4]

(Production of Organic Film Transistors)

Organic film transistors having the structure shown in FIG. 12 were produced in the same manner as Experiment 2 with the exception of preparing various types of compound (13) having different weight average molecular weights and number average molecular weights as shown in the following Table 8, and preparing organic semiconductor compositions of each of these compounds and the lower molecular weight compound (18) so that the blending ratio (weight ratio) of the former to the latter was 50:50.

(Evaluation of Characteristics)

Characteristics of the resulting organic film transistors of each sample were measured under conditions of changing the gate voltage Vg from 0 to −60 V and changing the source-drain voltage Vsd from 0 to −60 V, followed by determination of mobility from the resulting transfer characteristics.

Figure 14:
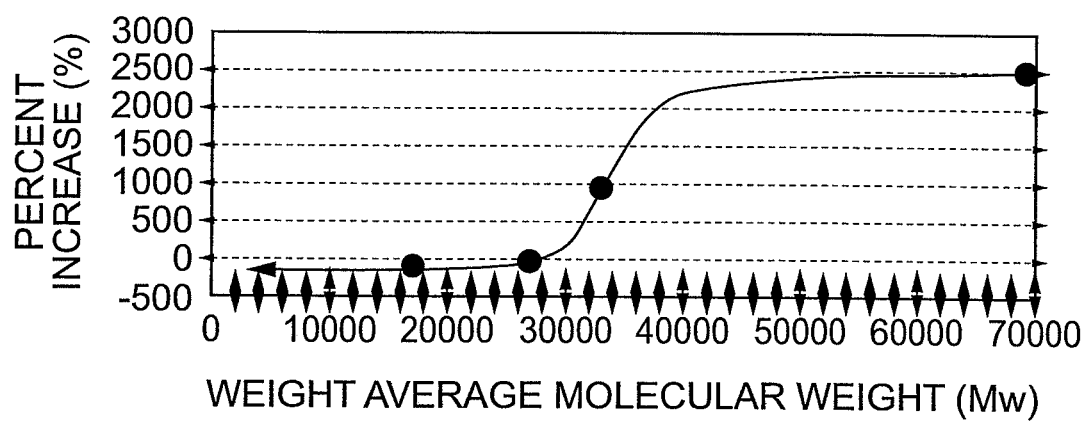
FIG. 14 is a graph in which values of the percent increase of mobility are plotted versus weight average molecular weight of a carrier transporting higher molecular weight compound.
Figure 15:
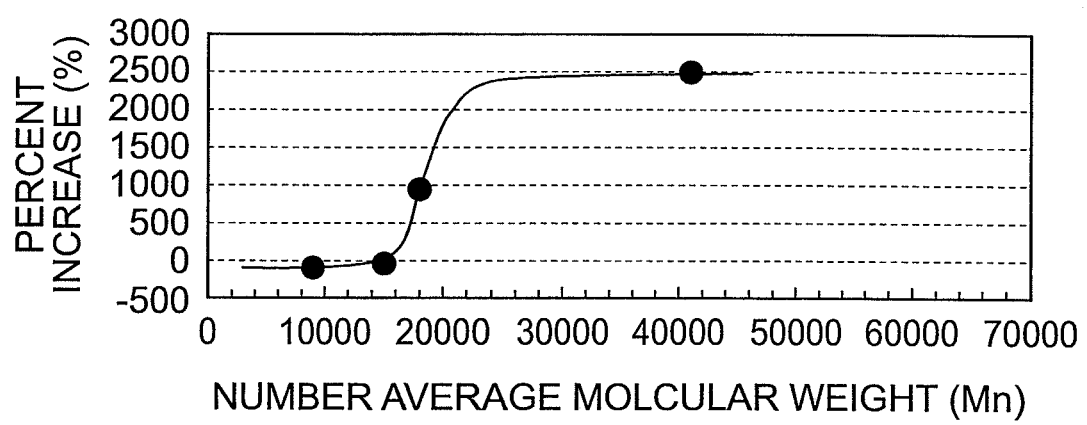
FIG. 15 is a graph in which values of the percent increase of mobility are plotted versus number average molecular weight of a carrier transporting higher molecular weight compound.

The percent increases in mobility were determined for the organic film transistors of each sample in the same manner as Experiment 3. The results obtained are shown in Table 8. In addition, FIG. 14 shows a graph in which the mobility percent increase values obtained with each sample are plotted versus the weight average molecular weight of the carrier transporting higher molecular weight compound used in each sample, while FIG. 15 shows a graph in which the mobility percent increase values obtained with each sample are plotted versus the number average molecular weight of the carrier transporting higher molecular weight compound used in each sample.

TABLE 7

| | Carrier Transporting Higher molecular weight compound | | | Lower molecular weight compound | | | Organic film Transistor | | |
|---|---|---|---|---|---|---|---|---|---|
| Sample | Compound | SP | Mobility (cm²/Vs)) | Compound | SP | Mobility (cm²/Vs) | ΔSP | Mobility | Percent increase Z (%) |
| 3 | (13) | 17.02 | $1.0 \times 10^{-2}$ | (18) | 18.02 | $8.1 \times 10^{-2}$ | 1.00 | 2.1 | 2493 |
| 11 | (14) | 15.99 | $3.3 \times 10^{-5}$ | (18) | 18.02 | $8.1 \times 10^{-2}$ | 2.03 | $2.0 \times 10^{-3}$ | −98 |
| 12 | (15) | 17.10 | $1.5 \times 10^{-3}$ | (18) | 18.02 | $8.1 \times 10^{-2}$ | 0.92 | $3.0 \times 10^{-1}$ | 270 |
| 13 | (16) | 16.80 | $1.3 \times 10^{-2}$ | (18) | 18.02 | $8.1 \times 10^{-2}$ | 1.22 | $8.8 \times 10^{-1}$ | 986 |
| 14 | (13) | 17.02 | $1.0 \times 20^{-2}$ | (19) | 18.96 | $1.1 \times 10^{-6}$ | 1.94 | $5.7 \times 10^{-4}$ | −94 |
| 15 | (14) | 15.99 | $3.3 \times 10^{-5}$ | (19) | 18.96 | $1.1 \times 10^{-6}$ | 2.97 | $1.8 \times 10^{-6}$ | −95 |
| 16 | (15) | 17.10 | $1.5 \times 10^{-3}$ | (19) | 18.96 | $1.1 \times 10^{-6}$ | 1.86 | $9.6 \times 10^{-5}$ | −94 |
| 17 | (16) | 16.80 | $1.3 \times 10^{-2}$ | (19) | 18.96 | $1.1 \times 10^{-6}$ | 2.16 | $3.3 \times 10^{-4}$ | −97 |
| 18 | (17) | 17.27 | $5.7 \times 10^{-2}$ | (19) | 18.96 | $1.1 \times 10^{-6}$ | 1.69 | $1.7 \times 10^{-2}$ | −70 |
| 19 | (13) | 17.02 | $1.0 \times 10^{-2}$ | (20) | 17.42 | $5.1 \times 10^{-4}$ | 0.40 | $1.0 \times 10^{-4}$ | −99 |
| 20 | (14) | 15.99 | $3.3 \times 10^{-5}$ | (20) | 17.42 | $5.1 \times 10^{-4}$ | 1.43 | $6.4 \times 10^{-4}$ | 25 |
| 21 | (15) | 17.10 | $1.5 \times 10^{-3}$ | (20) | 17.42 | $5.1 \times 10^{-4}$ | 0.32 | $7.0 \times 10^{-4}$ | −53 |
| 22 | (16) | 16.80 | $1.3 \times 10^{-2}$ | (20) | 17.42 | $5.1 \times 10^{-4}$ | 0.62 | $3.4 \times 10^{-2}$ | 162 |
| 23 | (17) | 17.27 | $5.7 \times 10^{-2}$ | (20) | 17.42 | $5.1 \times 10^{-4}$ | 0.15 | $1.7 \times 10^{-2}$ | −70 |

TABLE 8

| | Carrier Transporting Higher molecular weight compound | | | | Lower molecular weight compound | | Organic film Transistor | |
|---|---|---|---|---|---|---|---|---|
| Sample | Compound | Weight average molecular weight | Number average molecular weight | Mobility (cm²/Vs) | Compound | Mobility | Mobility | Percent increase Z (%) |
| 3 | (13) | 69000 | 41000 | $1.0 \times 10^{-2}$ | (18) | $8.1 \times 10^{-2}$ | 2.1 | 2493 |
| 24 | (13) | 33000 | 18000 | $1.0 \times 10^{-2}$ | (18) | $8.1 \times 10^{-2}$ | 0.84 | 9.4 |
| 25 | (13) | 27000 | 15000 | $1.0 \times 10^{-2}$ | (18) | $8.1 \times 10^{-2}$ | $5.1 \times 10^{-2}$ | −36 |
| 26 | (13) | 17000 | 9000 | $1.0 \times 10^{-2}$ | (18) | $8.1 \times 10^{-2}$ | $1.2 \times 10^{-3}$ | −99 |

The invention claimed is:

1. An organic semiconductor composition comprising, a lower molecular weight compound and a higher molecular weight compound having carrier transportability, wherein
the solubility parameter of the higher molecular weight compound and the solubility parameter of the lower molecular weight compound differ by 0.6 to 1.5.

2. The organic semiconductor composition according to claim 1, wherein the higher molecular weight compound and the lower molecular weight compound have a sea-island structure.

3. The organic semiconductor composition according to claim 1, wherein at least one of the higher molecular weight compound and the lower molecular weight compound has liquid crystallinity.

4. An organic film prepared by using the organic semiconductor composition according to claim 1.

5. The organic film according to claim 4, wherein the lower molecular weight compound is distributed concentratedly at the surface of the organic film.

6. An organic film element comprising the organic film according to claim 4.

7. An organic film transistor comprising a source electrode and a drain electrode, an organic semiconductor layer that serves as a current path between these electrodes, and a gate electrode that controls the amount of current that passes through the current path, wherein
the organic semiconductor layer is formed of the organic film according to claim 4.

8. An organic electroluminescent element comprising the organic film transistor according to claim 7.

9. An electronic tag comprising the organic film transistor according to claim 7.

10. A liquid crystal display element comprising the organic film transistor according to claim 7.

* * * * *